(12) United States Patent
Park et al.

(10) Patent No.: US 11,367,770 B2
(45) Date of Patent: Jun. 21, 2022

(54) DISPLAY DEVICE

(71) Applicant: Samsung Display Co., LTD., Yongin-si (KR)

(72) Inventors: Ju Chan Park, Seoul (KR); Sun Hee Lee, Hwaseong-si (KR); Sun Ho Kim, Seongnam-si (KR); Hyun Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/789,102

(22) Filed: Feb. 12, 2020

(65) Prior Publication Data

US 2021/0020723 A1  Jan. 21, 2021

(30) Foreign Application Priority Data

Jul. 17, 2019  (KR) .......................... 10-2019-0086662

(51) Int. Cl.
| | |
|---|---|
| *H01L 27/32* | (2006.01) |
| *H01L 51/00* | (2006.01) |
| *G09G 3/3225* | (2016.01) |
| *H01L 27/12* | (2006.01) |

(52) U.S. Cl.
CPC ...... *H01L 27/3276* (2013.01); *H01L 27/3262* (2013.01); *H01L 51/0097* (2013.01); *G09G 3/3225* (2013.01); *H01L 27/124* (2013.01); *H01L 27/1218* (2013.01); *H01L 27/323* (2013.01); *H01L 2251/5338* (2013.01)

(58) Field of Classification Search
CPC ............. H01L 27/3276; H01L 27/3262; H01L 27/1218; H01L 27/124; H01L 51/0097

USPC .......................................................... 257/72
See application file for complete search history.

(56) References Cited

U.S. PATENT DOCUMENTS

| | | | | |
|---|---|---|---|---|
| 2006/0238135 | A1* | 10/2006 | Kimura | G09G 3/20 315/169.3 |
| 2016/0118451 | A1* | 4/2016 | Youn | H01L 27/3262 257/40 |
| 2017/0077447 | A1* | 3/2017 | Kang | H01L 27/3246 |
| 2018/0047802 | A1* | 2/2018 | Yoon | H01L 27/3262 |
| 2019/0156708 | A1* | 5/2019 | Li | G09F 9/301 |
| 2019/0207150 | A1* | 7/2019 | Kwon | H01L 27/3248 |

FOREIGN PATENT DOCUMENTS

| | | |
|---|---|---|
| CN | 109166862 | 1/2019 |
| KR | 10-2016-0047132 | 5/2016 |
| KR | 10-2017-0039537 | 4/2017 |

OTHER PUBLICATIONS

English Machine Translation of Korean Patent No. KR20170039537 (Year: 2017).*
English Machine Translation of Korean Patent No. KR20160047132 (Year: 2016).*
English Machine Translation of Chinese Patent No. CN109166862 (Year: 2019).*

* cited by examiner

*Primary Examiner* — Dzung Tran
(74) *Attorney, Agent, or Firm* — Kile Park Reed & Houtteman PLLC

(57) ABSTRACT

Provided is a display device. The display device has a display area and a non-display area disposed around the display area and includes pixels disposed in the display area; and an intra-pixel bending area disposed along a direction of each of the pixels.

21 Claims, 27 Drawing Sheets

DISPLAY DEVICE

CROSS-REFERENCE TO RELATED APPLICATION

This application claims priority to and benefits of Korean Patent Application No. 10-2019-0086662 under 35 U.S.C. § 119, filed in the Korean Intellectual Property Office on Jul. 17, 2019, the entire contents of which are incorporated herein by reference.

BACKGROUND

1. Technical Field

The disclosure relates to a display device.

2. Description of the Related Art

The demand for display devices of various shapes and sizes for displaying images has been increasing because of the increasing and ongoing developments of information technology. For example, display devices are being applied to various electronic devices such as smartphones, digital cameras, notebook computers, navigation devices, and televisions. A display device may include a display panel including pixels connected to scan lines, data lines, and power supply lines to display an image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device in which cracks caused by inorganic layers in a pixel may be prevented.

However, aspects of the disclosure are not limited to the one set forth herein. The above and other aspects of the disclosure will become more apparent to one of ordinary skill in the art to which the disclosure pertains by referencing the detailed description of the disclosure given below.

According to an aspect of the disclosure, there is provided a display device having a display area and a non-display area disposed around the display area. The display device includes: pixels disposed in the display area; and an intra-pixel bending area disposed along a direction of each of the pixels.

The display device may further include subpixels in the display area and an extra-pixel bending area disposed around each of the subpixels and the intra-pixel bending area is disposed between each of the subpixels.

The display device may further include a scan line passing through each of the pixels, wherein the intra-pixel bending area may extend in the same direction as the scan line.

Each of the pixels may include a first transistor and a third transistor, and the intra-pixel bending area may be disposed between the first transistor and the third transistor in a plan view.

The first transistor may include a first semiconductor layer and a first gate electrode of the scan line, and the first semiconductor layer may be interrupted in the intra-pixel bending area.

The first semiconductor layer may include a first active layer, a first electrode disposed on a side of the first active layer and a second electrode disposed on the other side of the first active layer, and the second electrode may be interrupted in the intra-pixel bending area.

The display device may further include a first substrate, a barrier layer disposed on the first substrate, a buffer layer disposed on the barrier layer, the first semiconductor layer disposed on the buffer layer, an insulating layer disposed on the first semiconductor layer, and a first bending organic layer, wherein the first bending organic layer may penetrate the insulating layer and the first semiconductor layer in the intra-pixel bending area.

The first bending organic layer may further penetrate the buffer layer and may be disposed on a surface of the barrier layer.

The first bending organic layer may further penetrate the barrier layer and may be disposed on a surface of the first substrate.

The intra-pixel bending area may further include an intra-pixel connection line disposed on the first bending organic layer, and the intra-pixel connection line may electrically connect the interrupted first semiconductor layer.

The intra-pixel connection line and the scan line may include different materials.

The intra-pixel connection line may include aluminum, and the scan line may include molybdenum.

The intra-pixel connection line may extend in a direction intersecting or crossing the extending direction of the intra-pixel bending area.

The display device may further include an extra-pixel bending area around each of the pixels, wherein the extra-pixel bending area may be disposed between adjacent pixels.

The scan line may be interrupted in the extra-pixel bending area.

The display device may further include a first substrate, a barrier layer disposed on the first substrate, a buffer layer disposed on the barrier layer, the scan line disposed on the buffer layer, an insulating layer disposed on the scan line, and a second bending organic layer, wherein the second bending organic layer may penetrate the insulating layer and the scan line in the extra-pixel bending area.

The display device may further include an extra-pixel connection line extending in the same direction as the scan line, wherein the extra-pixel connection line may be disposed on the second bending organic layer.

The extra-pixel connection line may electrically connect the interrupted scan line.

The display device is foldable along a folding axis, and parts of the display area separated by the folding axis overlap each other when the display device is folded along the folding axis.

According to another aspect of the disclosure, there is provided a display device including: a first substrate; a barrier layer disposed on the first substrate; a buffer layer disposed on the barrier layer; a semiconductor layer disposed on the buffer layer; a scan line disposed on the semiconductor layer; an insulating layer disposed on the scan line; a bending organic layer which penetrates the insulating layer and the scan line; and an intra-pixel connection line disposed on the bending organic layer, wherein the scan line is interrupted by the bending organic layer, and the intra-pixel connection line electrically connects the scan line interrupted by the bending organic layer.

The scan line and the intra-pixel connection line may include different materials.

The intra-pixel connection line may include aluminum, and the scan line may include molybdenum.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
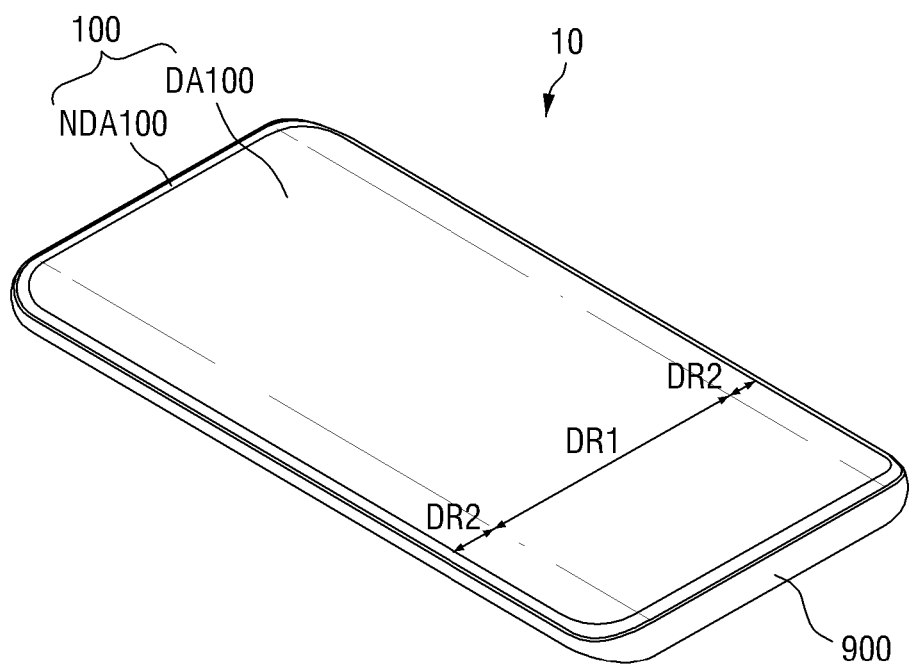
FIG. 1 is a perspective view of a display device according to an embodiment.

Advantages and features of the disclosure and methods of accomplishing the same may be understood more readily by reference to the following detailed description of the embodiments and the accompanying drawings. The disclosure may, however, be embodied in many different forms and should not be construed as being limited to the embodiments set forth herein. Rather, these embodiments are provided so that this disclosure will be thorough and complete and will fully convey the disclosure to those skilled in the art, and the disclosure will be defined by the appended claims.

Some of the parts which are not associated with the description may not be provided in order to describe embodiments of the invention and like reference numerals refer to like elements throughout the specification.

In the drawings, sizes and thicknesses of elements may be enlarged for clarity and ease of description thereof. However, the disclosure is not limited to the illustrated sizes and thicknesses. In the drawings, the thicknesses of layers, films, panels, regions, and other elements may be exaggerated for clarity.

Further, in the specification, the phrase "in a plan view" means when an object portion is viewed from above, and the phrase "in a schematic cross-sectional view" means a schematic cross-section taken by vertically cutting an object portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

It will be understood that, although the terms first, second, third, or the like, may be used herein to describe various elements, these elements should not be limited by these terms. These terms are only used to distinguish one element from another element. Thus, a first element discussed below could be termed a second element without departing from the teachings of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Respective features of embodiments of the disclosure may be partially or entirely joined or combined with each other, and technically various linkages and driving may be possible. The embodiments may be implemented independently or in association or combination with each other.

Hereinafter, embodiments will be described with reference to the attached drawings.

FIG. 1 is a perspective view of a display device 10 according to an embodiment.

Figure 2:
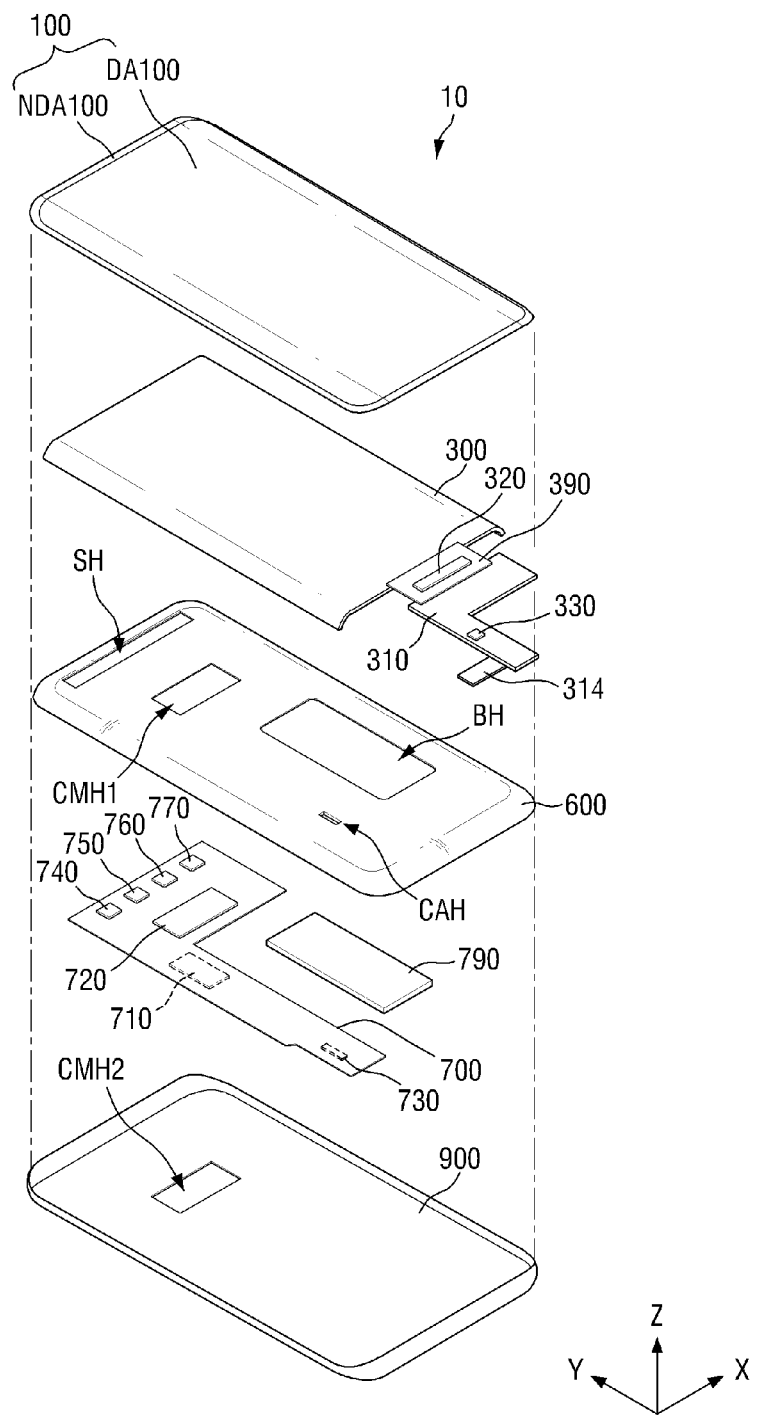
FIG. 2 is an exploded perspective view of the display device according to an embodiment.

FIG. 2 is an exploded perspective view of the display device 10 according to an embodiment.

Referring to FIGS. 1 and 2, the display device 10 according to the embodiment may include a cover window 100, a display panel 300, a display circuit board 310, a display driver circuit 320, a flexible film 390, a bracket 600, a main circuit board 700, sensor devices 740, 750, 760 and 770, and a bottom cover 900.

In the specification, the term "above" may indicate a direction in which the cover window 100 is disposed with respect to the display panel 300, that is, a Z-axis direction, and the term "below" may indicate a direction in which the bracket 600 is disposed with respect to the display panel 300, that is, a direction opposite to the Z-axis direction, or, opposite to a direction in which the cover window 100 is disposed with respect to the display panel 300. In addition, "left," "right," "upper" and "lower" may indicate directions when the display panel 300 is seen in a plan view. For example, "left" may indicate a direction opposite with respect to an X-axis direction, "right" may indicate a direction opposite to "left" with respect to the X-axis direction, "upper" may indicate the Z-axis direction (or a Y-axis direction), and "lower" may indicate the direction opposite to "upper" with respect to the Z-axis direction (or, a direction opposite with respect to the Y-axis direction). In other words, the spatially relative terms "below", "beneath", "lower", "above", "upper", or the like, may be used herein for ease of description to describe the relations between one element or component and another element or component as illustrated in the drawings. It will be understood, however, that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The display device 10 may be a device for displaying moving images or still images. The display device 10 may be used, for example, as a display screen in portable electronic devices such as mobile phones, smartphones, tablet personal computers (PCs), smart watches, watch phones, mobile communication terminals, electronic notebooks, electronic books, portable multimedia players (PMPs), navigation systems and ultra-mobile PCs (UMPCs), as well as in various products such as televisions, notebook computers, monitors, billboards and the Internet of things (IoT). However, the device may be used in other devices and is not limited to the examples set forth herein.

The display device 10 may be rectangular in a plan view. For example, the display device 10 may have a rectangular planar shape having short sides in a first direction (X-axis direction) and long sides in a second direction (Y-axis direction) as illustrated in FIGS. 1 and 2. However, it is to be understood that the device may have short sides in a second direction (Y-axis direction) and long sides in a first direction (X-axis direction). Each corner where a short side extending in the first direction (X-axis direction) meets a long side extending in the second direction (Y-axis direction) may be rounded with a predetermined curvature or may be right-angled. The planar shape of the display device 10 is not limited to the rectangular shape, but may also be another polygonal shape, a circular shape, or an elliptical shape, or other shapes within the spirit and scope of the disclosure.

The display device 10 may include a first area DR1 formed flat and a second area DR2 extending from right and left sides of the first area DR1. The second area DR2 may be formed flat or curved. When the second area DR2 is formed flat, an angle formed by the first area DR1 and the second area DR2 may be an obtuse angle or approximately an obtuse angle. When the second area DR2 is formed curved, it may have a constant curvature or a varying curvature.

In FIG. 1, the second area DR2 may extend from each of the right and left sides of the first area DR1. However, embodiments are not limited thereto. For example, the second area DR2 may also extend from only one of the right and left sides of the first area DR1. In other embodiments, the second area DR2 may extend not only from the right and left sides of the first area DR1 but also from at least any one of upper and lower sides of the first area DR1. A case where the second area DR2 is disposed at right and left edges of the display device 10 will be described below.

The cover window 100 may be disposed on the display panel 300 to cover an upper surface of the display panel 300. Thus, the cover window 100 may function to protect the upper surface of the display panel 300.

The cover window 100 may be disposed in the first area DR1 and the second areas DR2. The cover window 100 may include a light transmitting portion DA100 corresponding to the display panel 300 and a light shielding portion NDA100 corresponding to an area other than the display panel 300. The light shielding portion NDA 100 may be formed opaque. In other embodiments, the light shielding portion NDA100 may be formed as a decorative layer having a pattern that may be visible to a user when an image is not displayed. Although not shown, the cover window 100 may include a second light transmitting portion.

The display panel 300 may be disposed under the cover window 100. The display panel 300 may be disposed in the first area DR1 and the second areas DR2. Therefore, an image of the display panel 300 can be seen not only in the first area DR1 but also in the second areas DR2 through the cover window 100. For example, an image displayed on the display panel 300 can be seen on an upper surface and the left and right edges of the display device 10 through the cover window 100.

The display panel 300 may include a display area DA and a non-display area NDA disposed around the display area DA. The display area DA may be overlapped by the light transmitting portion DA100 of the cover window 100.

The display panel 300 may be a light emitting display panel including light emitting elements. For example, the display panel 300 may be an organic light emitting display panel using organic light emitting diodes that include organic light emitting layers, a micro light emitting diode display panel using micro light emitting diodes, a quantum dot light emitting display panel including quantum dot light emitting diodes that include quantum dot light emitting layers, or an inorganic light emitting display panel using inorganic light emitting elements that include inorganic semiconductors. However, the display panel 300 is not limited thereto and may include other types of display panels. A case where the display panel 300 is an organic light emitting display panel will be described below.

Figure 3:
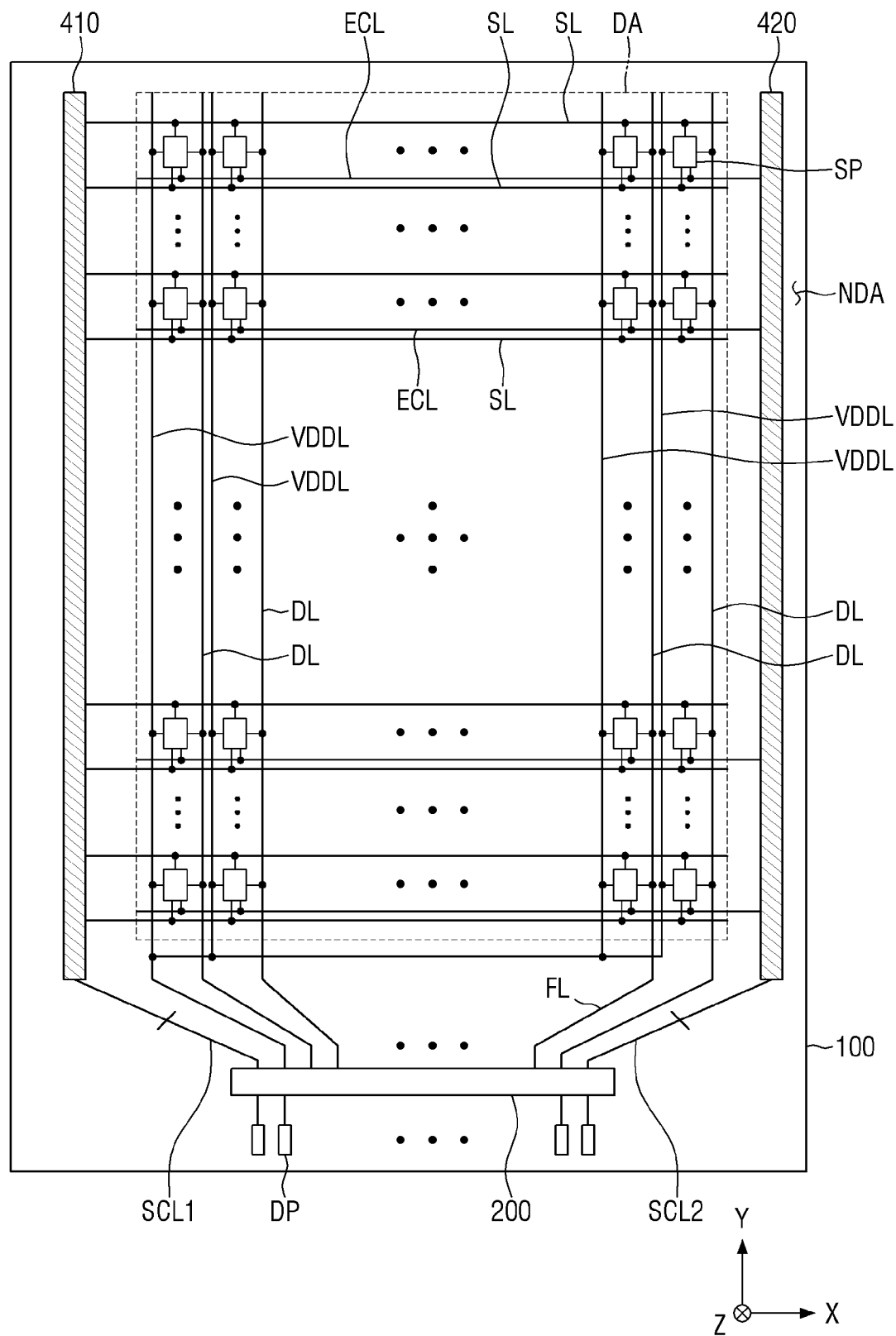
FIG. 3 is a plan view of a display panel according to an embodiment.

The display circuit board 310 and the display driver circuit 320 may be attached to a side of the display panel 300. An end of the display circuit board 310 may be attached onto pads DP, as illustrated for example in FIG. 3, provided on the side of the display panel 300 by using, for example, an anisotropic conductive film. The display circuit board 310 may be a flexible printed circuit board that may be bent, a rigid printed circuit board that is rigid and not easily bent, or a composite printed circuit board including both a rigid printed circuit board and a flexible printed circuit board.

The display driver circuit 320 may receive control signals and power supply voltages through the display circuit board 310 and may generate signals and voltages for driving the display panel 300. The display driver circuit 320 may be formed as an integrated circuit and attached onto the display panel 300 using a chip-on glass (COG) method, a chip-on plastic (COP) method, or an ultrasonic method. However, embodiments are not limited to this case. For example, the display driver circuit 320 may be attached onto the display circuit board 310.

A touch driver circuit 330 may be disposed on the display circuit board 310. The touch driver circuit 330 may be formed as an integrated circuit and attached to an upper surface of the display circuit board 310. The touch driver circuit 330 may be electrically connected to touch electrodes of a touch sensor layer of the display panel 300 through the display circuit board 310. The touch driver circuit 330 may transmit touch driving signals to driving electrodes among the touch electrodes and output touch data including a user's touch coordinates by detecting amounts of charge change in capacitances between the driving electrodes and sensing electrodes among the touch electrodes through the sensing electrodes. A power supply unit 340 (see FIG. 4) may be disposed on the display circuit board 310 to supply display driving voltages for driving the display driver circuit 320.

A side of the flexible film 390 may be attached onto the upper surface of the display panel 300 at a lower side of the display panel 300 by using, for example, an anisotropic conductive film. The other side of the flexible film 390 may be attached onto the upper surface of the display circuit board 310 at an upper side of the display circuit board 310 by using, for example, an anisotropic conductive film. The flexible film 390 may be a flexible film that may be bent.

In an embodiment, the flexible film 390 may be omitted, and the display circuit board 310 may be attached (for example, directly attached) to the side of the display panel 300. For example, the side of the display panel 300 may be bent toward a lower surface of the display panel 300.

The bracket 600 may be disposed under the display panel 300. The bracket 600 may include plastic, metal, or both plastic and metal. The bracket 600 may include a first camera hole CMH1 into which a first camera sensor 720 may be inserted, a battery hole BH in which a battery 790 may be disposed, a cable hole CAH through which a cable 314 connected to the display circuit board 310 passes, and a sensor hole SH in which the sensor devices 740, 750, 760 and 770 may be disposed. In other embodiments, the bracket 600 may not include the sensor hole SH and may not overlap a sensor area of the display panel 300.

The main circuit board 700 and the battery 790 may be disposed under the bracket 600. The main circuit board 700 may be a printed circuit board or a flexible printed circuit board.

The main circuit board 700 may include a main processor 710, the first camera sensor 720, a main connector 730, and the sensor devices 740, 750, 760 and 770. The first camera sensor 720 may be disposed on both upper and lower surfaces of the main circuit hoard 700, the main processor 710 may be disposed on the upper surface of the main circuit board 700, and the main connector 730 may be disposed on the lower surface of the main circuit board 700. The sensor devices 740, 750, 760 and 770 may be disposed on the upper surface of the main circuit board 700.

The main processor 710 may control the functions of the display device 10. For example, the main processor 710 may output digital video data to the display driver circuit 320 through the display circuit board 310 so that the display panel 300 may display an image. The main processor 710 may receive touch data from the touch driver circuit 330, determine a user's touch coordinates, and then execute an application indicated by an icon displayed at the user's touch coordinates.

The main processor 710 may control the display device 10 according to sensor signals received from the sensor devices 740, 750, 760 and 770. For example, the main processor 710 may determine whether an object is located close to the upper surface of the display device 10 according to a proximity sensor signal received from a proximity sensor 740. When an object is located close to the upper surface of the display device 10 in a call mode in which a user talks to another party using the display device 10, the main processor 710 may not execute an application indicated by an icon displayed at touch coordinates even if the user performs a touch action.

The main processor 710 may determine the brightness of the upper surface of the display device 10 according to an illuminance sensor signal received from an illuminance sensor 750. The main processor 710 may adjust the luminance of an image displayed on the display panel 300 according to the brightness of the upper surface of the display device 10.

The main processor 710 may determine whether an iris image of a user is identical to an iris image which is, for example, pre-stored in a memory according to an iris sensor signal received from an iris sensor 760. When the iris image of the user is identical to the iris image, the main processor 710 may unlock the display device 10 and display a home screen on the display panel 300. Sensor devices 740, 750, 760 and 770 are not limited to the above-described functions, but may include other types of sensors and other types of functions.

The first camera sensor 720 processes an image frame such as a still image or a moving image obtained by an image sensor and outputs the processed image frame to the main processor 710. The first camera sensor 720 may be a complementary metal oxide semiconductor (CMOS) image sensor or a charge coupled device (CCD) sensor. The first camera sensor 720 may be exposed through a second camera hole CMH2 in a lower surface of the bottom cover 900. Therefore, the first camera sensor 720 may photograph an object or background disposed under the display device 10.

The cable 314 passing through the cable hole CAH of the bracket 600 may be connected to the main connector 730. Therefore, the main circuit board 700 may be electrically connected to the display circuit board 310.

The sensor devices 740, 750, 760 and 770 may include the proximity sensor 740, the illuminance sensor 750, the iris sensor 760, and a second camera sensor 770. The sensor devices 740, 750, 760 and 770 are not limited to those illustrated in FIG. 2 as noted above.

The proximity sensor 740 may be a sensor for detecting whether an object is located close to the upper surface of the display device 10. The proximity sensor 740 may include a light source which outputs light and a light reception unit which receives light reflected by an object. The proximity sensor 740 may determine whether there is an object located close to the upper surface of the display device 10 according to the amount of light reflected by the object. The proximity sensor 740 may be overlapped by the sensor hole SH, the sensor area of the display panel 300, and a second light transmitting portion of the cover window 100 in a thickness direction (Z-axis direction) of the display panel 300. Therefore, the proximity sensor 740 may generate a proximity sensor signal according to whether there is an object located close to the upper surface of the display device 10 and output the proximity sensor signal to the main processor 710.

The illuminance sensor 750 may be a sensor for detecting the brightness of the upper surface of the display device 10. The illuminance sensor 750 may include a resistor whose resistance value varies according to the brightness of incident light. The illuminance sensor 750 may determine the brightness of the upper surface of the display device 10 according to the resistance value of the resistor. The illuminance sensor 750 may be overlapped by the sensor hole SH, the sensor area of the display panel 300, and the second light transmitting portion of the cover window 100 in the thickness direction (Z-axis direction) of the display panel 300. Therefore, the illuminance sensor 750 may generate an illuminance sensor signal according to the brightness of the upper surface of the display device 10 and output the illuminance sensor signal to the main processor 710.

The iris sensor 760 may be a sensor for detecting whether a photographed image of a user's iris is identical to an iris image which is, for example, pre-stored in the memory. The iris sensor 760 may generate an iris sensor signal according to whether the iris image of the user is identical to the iris image and output the iris sensor signal to the main processor 710.

The second camera sensor 770 may process an image frame such as a still image or a moving image obtained by an image sensor and outputs the processed image frame to the main processor 710. The second camera sensor 770 may be a CMOS image sensor or a CCD sensor. The number of pixels of the second camera sensor 770 may be less than that of the first camera sensor 720, and the second camera sensor 770 may be smaller in size than the first camera sensor 720. The second camera sensor 770 may be overlapped by the sensor hole SH, the sensor area of the display panel 300, and the second light transmitting portion of the cover window 100 in the thickness direction (Z-axis direction) of the display panel 300. Therefore, the second camera sensor 770 may photograph an object or background disposed above the display device 10. It is to be understood that the number of pixels of the first camera sensor 720 and the second camera sensor 770 is not limited to the above description and may vary according to embodiments. Likewise, the sizes of the first and second camera sensors 720 and 770 may vary according to embodiments.

The battery 790 may be disposed not to overlap the main circuit board 700 in a third direction (Z-axis direction). The battery 790 may be overlapped by the battery hole BH of the bracket 600.

The main circuit board 700 may be equipped with a mobile communication module capable of transmitting or receiving wireless signals to or from at least one of a base station, an external terminal, and a server over a mobile communication network. The wireless signals may include voice signals, video call signals, or various forms of data according to transmission/reception of text/multimedia messages.

The bottom cover 900 may be disposed under the main circuit board 700 and the battery 790. The bottom cover 900 may be fastened and fixed to the bracket 600. The bottom cover 900 may form the bottom exterior of the display device 10. The bottom cover 900 may include plastic, metal, or both plastic and metal.

The second camera hole CMH2 exposing a lower surface of the first camera sensor 720 may be formed in the bottom cover 900. The position of the first camera sensor 720 and the positions of the first and second camera holes CMH1 and CMH2 corresponding to the first camera sensor 720 are not limited to the embodiment illustrated in FIG. 2.

Figure 4:
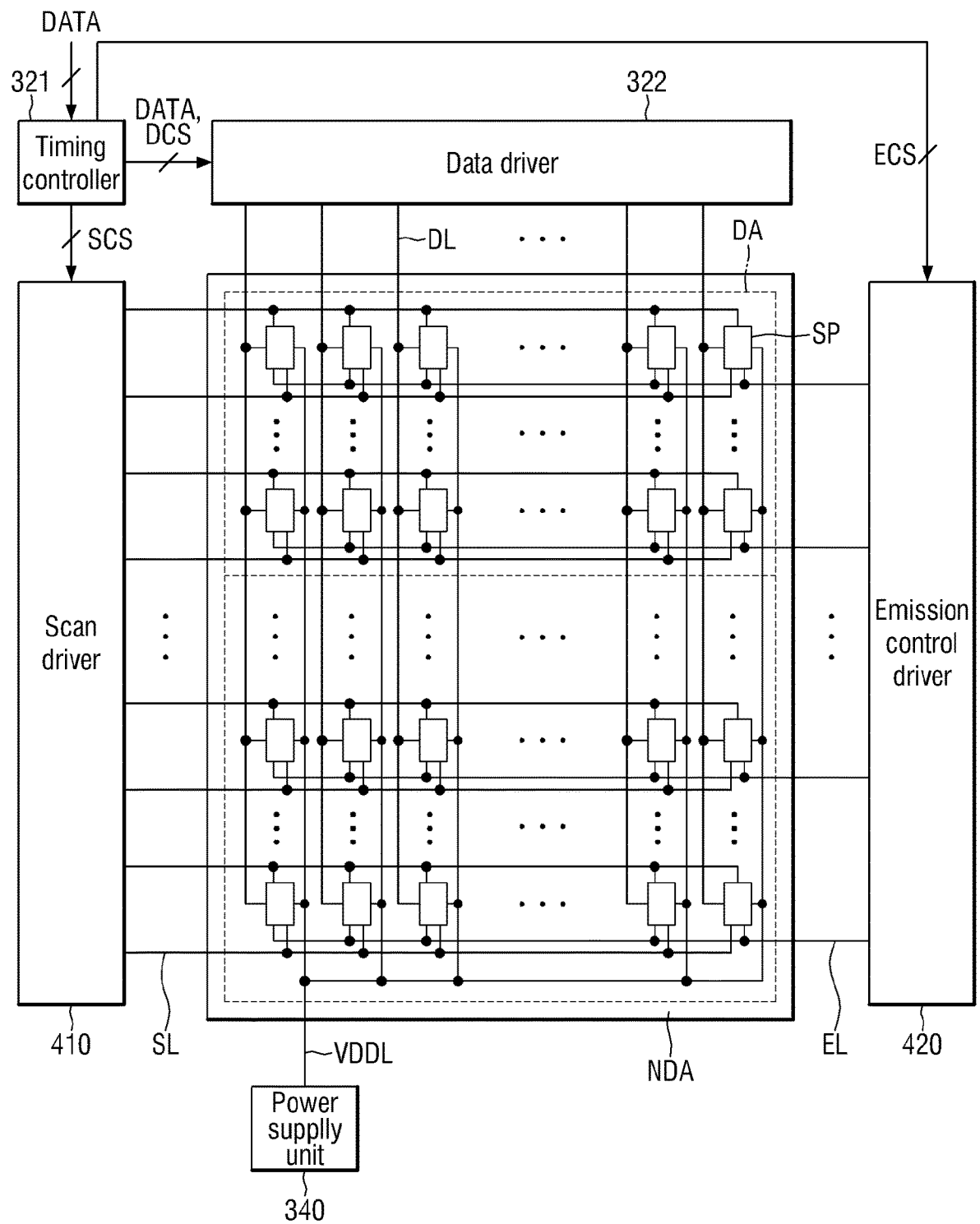
FIG. 4 is a block diagram of the display panel and a display driver circuit according to an embodiment.

FIG. 3 is a plan view of the display panel 300 according to an embodiment. FIG. 4 is a block diagram of the display panel 300 and the display driver circuit 320 according to an embodiment.

Referring to FIGS. 3 and 4, the display panel 300 may include the display area DA including subpixels SP and the non-display area NDA not including the subpixels SP.

The subpixels SP, scan lines SL, emission lines ECL, data lines DL and first driving voltage lines VDDL connected to the subpixels SP may be disposed in the display area DA. The scan lines SL and the emission lines ECL may extend parallel to each other in the first direction (X-axis direction), and the data lines DL may extend parallel to each other in the second direction (Y-axis direction) intersecting or crossing the first direction (X-axis direction). The first driving voltage lines VDDL may extend parallel to each other in the display area DA along the second direction (Y-axis direction). The first driving voltage lines VDDL extending parallel to each other in the display area DA along the second direction (Y-axis direction) may be connected to each other in the non-display area NDA.

Each of the subpixels SP may be connected to at least any one of the scan lines SL, any one of the data lines DL, at least one of the emission lines ECL, and any one of the first driving voltage lines VDDL. In FIGS. 3 and 4, each of the subpixels SP connected to two scan lines SL, one data line DL, one emission line ECL, and one first driving voltage line VDDL is illustrated as an example for ease of description. However, embodiments are not limited thereto. For example, each of the subpixels SP may also be connected to three scan lines SL instead of two scan lines SL.

Each of the subpixels SP may include a driving transistor DT, one or more transistors ST, a light emitting element, and a capacitor. The driving transistor DT may supply a driving current to the light emitting element according to a data voltage applied to a gate electrode, thereby causing the light emitting element to emit light. The driving transistor DT and the transistors ST may be thin-film transistors. The light emitting element may emit light according to the driving current of the driving transistor DT. The light emitting element may be an organic light emitting diode including a first electrode, an organic light emitting layer, and a second electrode. The capacitor may keep the data voltage applied to the gate electrode of the driving transistor DT constant.

The non-display area NDA may be defined as an area excluding the display area DA from the display panel 300. In the non-display area NDA, a scan driver 410 for transmitting scan signals to the scan lines SL, fan-out lines FL connecting the data lines DL and the display driver circuit 320, and pads DP connected to the display driver circuit 320 may be disposed. The display driver circuit 320 and the pads DP may be disposed at an edge of the display panel 300. The pads DP may be disposed closer to the edge of the display panel 300 than the display driver circuit 320.

The scan driver 410 may be connected to the display driver circuit 320 by first scan control lines SCL1. The scan driver 410 may receive a scan control signal SCS from the display driver circuit 320 through the first scan control lines SCL1. The scan driver 410 may generate scan signals according to the scan control signal SCS and sequentially output the scan signals to the scan lines SL.

An emission control driver 420 may be connected to the display driver circuit 320 by second scan control lines SCL2. The emission control driver 420 may receive an emission control signal ECS from the display driver circuit 320 through the second scan control lines SCL2. The emission control driver 420 may generate emission control signals according to the emission control signal ECS and sequentially output the emission control signals to the emission lines ECL.

As illustrated in FIG. 3, the scan driver 410 may be disposed outside a side of a general area and a sensor area, and the emission control driver 420 may be disposed outside the other side of the general area and the sensor area. The general area may be any area in the non-display area NDA. In other embodiments, both the scan driver 410 and the emission control driver 420 may be disposed outside a side of the general area and the sensor area.

The scan driver 410 may include thin-film transistors for generating scan signals according to the scan control signal SCS, and the emission control driver 420 may include thin-film transistors for generating emission control signals according to the emission control signal ECS. For example, the thin-film transistors of the scan driver 410 and the thin-film transistors of the emission control driver 420 may be formed on the same layer as the thin-film transistors of the subpixels SP.

The display driver circuit 320 may include a timing controller 321 and a data driver 322 as illustrated in FIG. 4.

The timing controller 321 may receive data DATA (for example, digital video data) and timing signals from the display circuit board 310. According to the timing signals, the timing controller 321 may generate the scan control signal SCS for controlling the operation timing of the scan driver 410, generate the emission control signal ECS for controlling the operation timing of the emission control driver 420, and generate a data control signal DCS for controlling the operation timing of the data driver 322. The timing controller 321 may output the scan control signal SCS to the scan driver 410 and the emission control signal ECS to the emission control driver 420 through scan control lines SCL. The timing controller 321 may output the digital video data DATA and the data control signal DCS to the data driver 322.

The data driver 322 may convert the digital video data DATA into positive/negative analog data voltages and output the positive/negative analog data voltages to the data lines DL through the fan-out lines FL. Subpixels SP may be selected by the scan signals of the scan driver circuit 400, and data voltages may be supplied to the selected subpixels SP.

The power supply unit 340 may generate a first driving voltage and supply the first driving voltage to the first driving voltage lines VDDL. The power supply unit 340 may generate a second driving voltage and supply the second driving voltage to a cathode of the organic light emitting diode of each of the subpixels SP. The first driving voltage may be a high-potential voltage for driving the organic light emitting diode, and the second driving voltage may be a low-potential voltage for driving the organic light emitting diode. For example, the first driving voltage may have a higher potential than the second driving voltage. The power supply unit 340 may generate driving voltages for driving the display driver circuit 320 and the scan driver circuit 400, such as a display driving voltage, a gate high voltage and a gate low voltage, and supply the driving voltages to the display driver circuit 320.

The display driver circuit 320 may be formed as an integrated circuit and attached onto the display panel 300 using a COG method, a COP method, or an ultrasonic bonding method. However, embodiments are not limited thereto. For example, the display driver circuit 320 may be attached onto the display circuit board 310.

Figure 5:
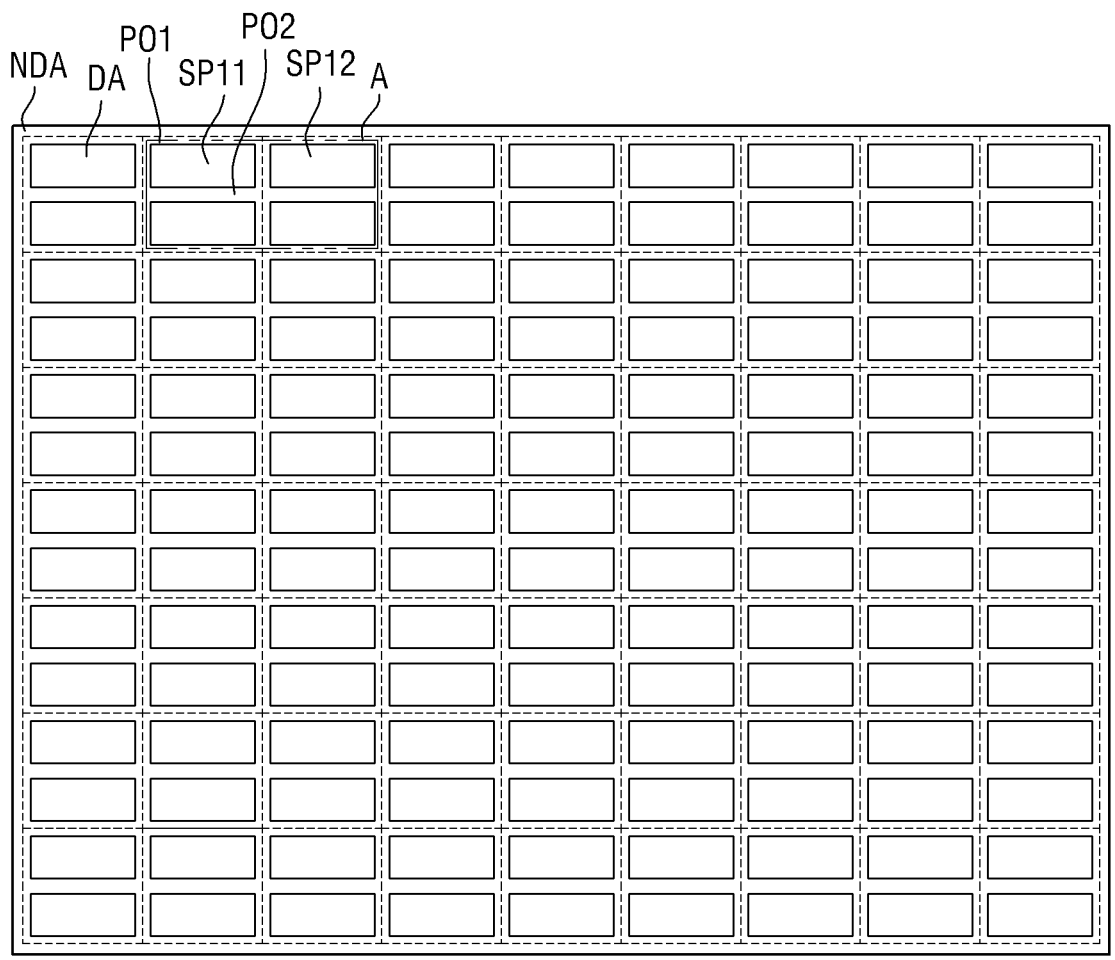
FIG. 5 is a schematic plan view of the display panel according to an embodiment.
Figure 5:
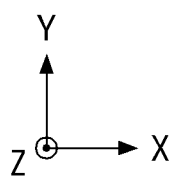

FIG. 5 is a schematic plan view of the display panel 300 according to an embodiment.

Referring to FIG. 5, the subpixels SP, including first and second subpixels SP11 and SP12, may be arranged along the first direction (X-axis direction) and the second direction (Y-axis direction) illustrated in FIG. 3. In FIG. 5, the subpixels SP may be disposed in the display area DA. The display area DA may include the subpixels SP. An extra-pixel bending area may be located or disposed around the subpixels SP.

An intra-pixel bending area may be located or disposed in each of the subpixels SP. The extra-pixel bending area may surround or substantially surround or be around the periphery of each subpixel SP in a plan view. The extra-pixel bending area may be disposed between adjacent subpixels SP11 and SP12 in a plan view.

The extra-pixel bending area may be disposed in the display area DA and the non-display area NDA of the display panel 300. As illustrated in FIG. 5, the extra-pixel bending area may have a lattice shape in a plan view.

The intra-pixel bending area may be disposed in each of the subpixels SP in a plan view. The intra-pixel bending area may extend along the first direction (X-axis direction).

The intra-pixel bending area may be physically connected to the adjacent extra-pixel bending area.

A first bending organic layer PO1 may be disposed in the extra-pixel bending area, A second bending organic layer PO2 may be disposed in the intra-pixel bending area.

A detailed description of the first bending organic layer PO1 and the second bending organic layer PO2 will follow.

As illustrated in FIG. 5, the intra-pixel bending area may be located or disposed in each of the subpixels SP disposed in the display area DA according to the embodiment. For example, the second bending organic layer PO2 of the intra-pixel bending area may be disposed in each of the subpixels SP.

In other embodiments, the intra-pixel bending area may be disposed in a first area of the display area DA and may not be disposed in a second area excluding the first area from the display area DA. For example, the intra-pixel bending area may be disposed in a part of the display panel 300 and may not be disposed in an area other than the part of the display panel 300.

In other embodiments, the intra-pixel bending area may be disposed in a first group of subpixels SP and may not be disposed in a second group of subpixels SP excluding the first group of subpixels SP. For example, the intra-pixel bending area may be applied on a group-by-group basis in order to prevent cracking of the layers in the pixels.

Figure 6:
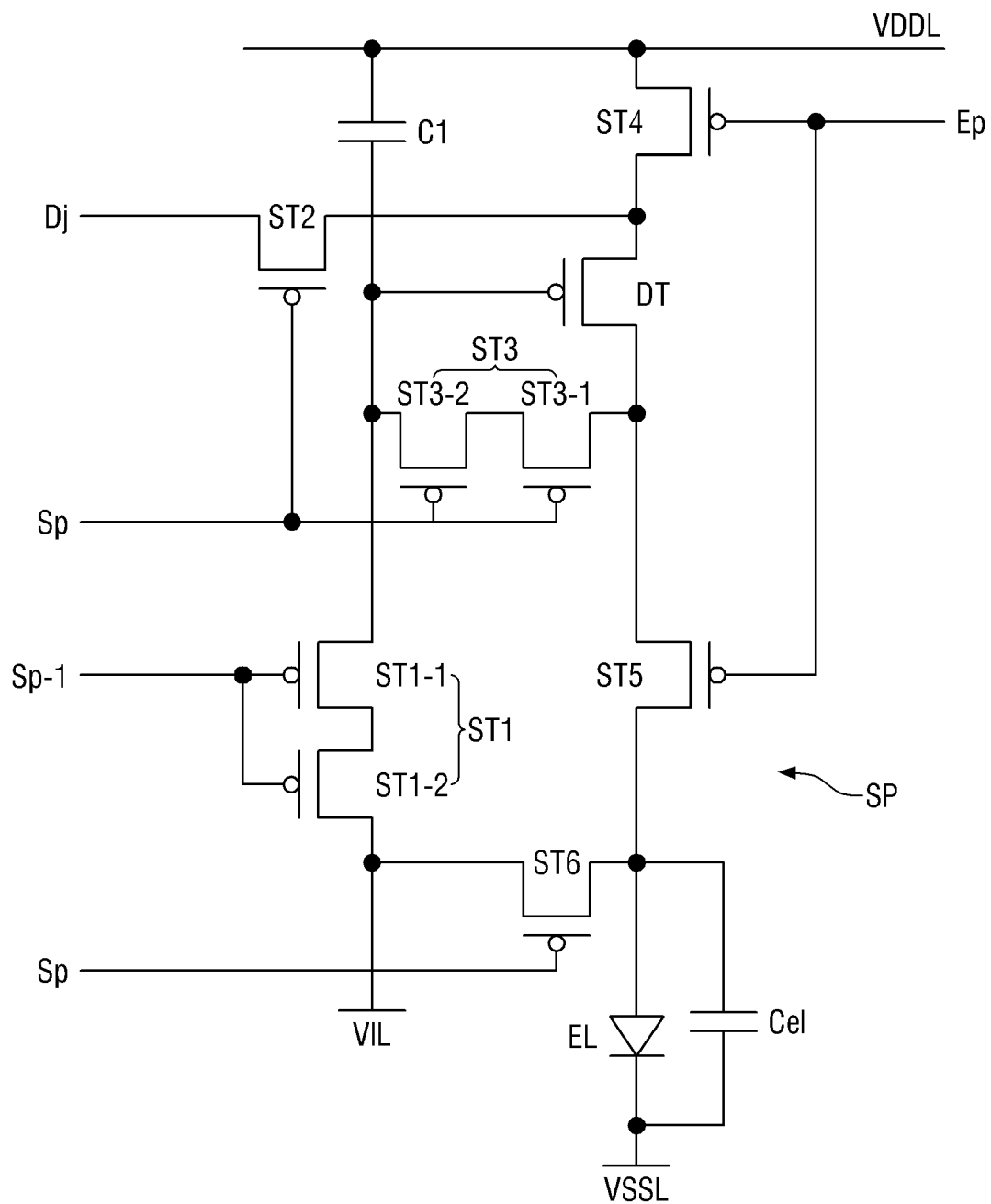
FIG. 6 is a circuit diagram of a subpixel according to an embodiment.

FIG. 6 is a circuit diagram of a subpixel SP according to an embodiment.

In FIG. 6, a subpixel SP may be connected to a $(p-1)^{th}$ scan line Sp−1, a $p^{th}$ scan line Sp, and $j^{th}$ data line Dj.

Referring to FIG. 6, the subpixel SP may overlap the $(p-1)^{th}$ scan line Sp−1, the $p^{th}$ scan line Sp, and the $j^{th}$ data line Dj. The subpixel SP may be connected to a first driving voltage line VDDL to which the first driving voltage is supplied, an initialization voltage line VIL to which an initialization voltage Vini is supplied, and a second driving voltage line VSSL to which the second driving voltage is supplied.

The subpixel SP may include a driving transistor DT, a light emitting element EL, switching elements, a first capacitor C1, a second capacitor C2, and the like. The switching elements may include first through sixth transistors ST1 through ST6.

The light emitting element EL may be an organic light emitting diode including an anode, a cathode, and an organic light emitting layer disposed between the anode and the cathode. In other embodiments, the light emitting element EL may be an inorganic light emitting element including an anode, a cathode, and an inorganic semiconductor disposed between the anode and the cathode. In other embodiments, the light emitting element EL may be a quantum dot light emitting element including an anode, a cathode, and a quantum dot light emitting layer disposed between the anode and the cathode. In other embodiments, the light emitting element EL may be a micro light emitting diode.

The light emitting element EL may have the anode connected to a second electrode of the fifth transistor ST5 and the cathode connected to the second driving voltage line VSSL. A parasitic capacitance Cel may be formed between the anode and the cathode of the light emitting element EL.

The first transistor ST1 may be formed as a dual transistor including a (1-1)th transistor ST1-1 and a (1-2)th transistor ST1-2. The (1-1)th transistor ST1-1 and the (1-2)th transistor ST1-2 are turned on by a scan signal of the (p−1)th scan line Sp−1 and connects a gate electrode of the driving transistor DT and the initialization voltage line VIL. The gate electrode of the driving transistor DT may be discharged to the initialization voltage of the initialization voltage line VIL. The (1-1)th transistor ST1-1 may have a gate electrode connected to the (p−1)th scan line Sp−1, a first electrode connected to the gate electrode of the driving transistor DT, and a second electrode connected to a first electrode of the (1-2)th transistor ST1-2. The (1-2)th transistor ST1-2 may have a gate electrode connected to the (p−1)th scan line Sp−1, the first electrode connected to the second electrode of the (1-1)th transistor ST1-1, and a second electrode connected to the initialization voltage line VIL.

The second transistor ST2 may be turned on by a scan signal of the pth scan line Sp and may connect a first electrode of the driving transistor DT and the jth data line Dj. The second transistor ST2 may have a gate electrode connected to the pth scan line Sp, a first electrode connected to the first electrode of the driving voltage DT, and a second electrode connected to the jth data line Dj.

The third transistor ST3 may be formed as a dual transistor including a (3-1)th transistor ST3-1 and a (3-2)th transistor ST3-2. The (3-1)th transistor ST3-1 and the (3-2)th transistor ST3-2 may be turned on by the scan signal of the pth scan line Sp and may connect the gate electrode and a second electrode of the driving transistor DT. For example, since the gate electrode and the second electrode of the driving transistor DT may be connected when the (3-1)th transistor ST3-1 and the (3-2)th transistor ST3-2 are turned on, the driving transistor DT may be driven as a diode. The (3-1)th transistor ST3-1 may have a gate electrode connected to the pth scan line Sp, a first electrode connected to the second electrode of the driving transistor DT, and a second electrode connected to a first electrode of the (3-2)th transistor ST3-2. The (3-2)th transistor ST3-2 may have a gate electrode connected to the pth scan line Sp, the first electrode connected to the second electrode of the (3-1)th transistor ST3-1, and a second electrode connected to the gate electrode of the driving transistor DT.

The fourth transistor ST4 may be turned on by an emission control signal of a pth emission line Ep and connects the first electrode of the driving transistor DT and the first driving voltage line VDDL. The fourth transistor ST4 may have a gate electrode connected to the pth emission line Ep, a first electrode connected to the first driving voltage line VDDL, and a second electrode connected to a source electrode of the driving transistor DT.

The fifth transistor ST5 may be connected between the second electrode of the driving transistor DT and the anode of the light emitting element EL. The fifth transistor ST5 may be turned on by the emission control signal of the pth emission line Ep and connects the second electrode of the driving transistor DT and the anode of the light emitting element EL. The fifth transistor ST5 may have a gate electrode connected to the pth emission line Ep, a first electrode connected to the second electrode of the driving transistor DT, and the second electrode connected to the anode of the light emitting element EL. When the fourth transistor ST4 and the fifth transistor ST5 are all turned on, a driving current Ids may be supplied to the light emitting element EL.

The sixth transistor ST6 may be turned on by the scan signal of the pth scan line Sp and may connect the anode of the light emitting element EL and the initialization voltage line VIL. The anode of the light emitting element EL may be discharged to the initialization voltage. The sixth transistor ST6 may have a gate electrode connected to the pth scan line Sp, a first electrode connected to the anode of the light emitting element EL, and a second electrode connected to the initialization voltage line VIL.

The first capacitor C1 may be formed between the second electrode of the driving transistor DT and the first driving voltage line VDDL. An electrode of the first capacitor C1 may be connected to the second electrode of the driving transistor DT, and the other electrode may be connected to the first driving voltage line VDDL.

When the first electrode of each of the first through sixth transistors ST1 through ST6 and the driving transistor DT is a source electrode, the second electrode may be a drain electrode. In other embodiments, when the first electrode of each of the first through sixth transistors ST1 through ST6 and the driving transistor DT is a drain electrode, the second electrode may be a source electrode.

An active layer of each of the first through sixth transistors ST1 through ST6 and the driving transistor DT may be made of at least one of polycrystalline silicon, amorphous silicon, and an oxide semiconductor. When a semiconductor layer of each of the first through sixth transistors ST1 through ST6 and the driving transistor DT is made of polycrystalline silicon, a process for forming the semiconductor layer may be a low-temperature polysilicon (LTPS) process.

Although the first through sixth transistors ST1 through ST6 and the driving transistor DT may be formed as P-type metal oxide semiconductor field effect transistors (MOSFETs), embodiments are not limited thereto, and the first through sixth transistors ST1 through ST6 and the driving transistor DT may also be formed as N-type MOSFETs.

Figure 7:
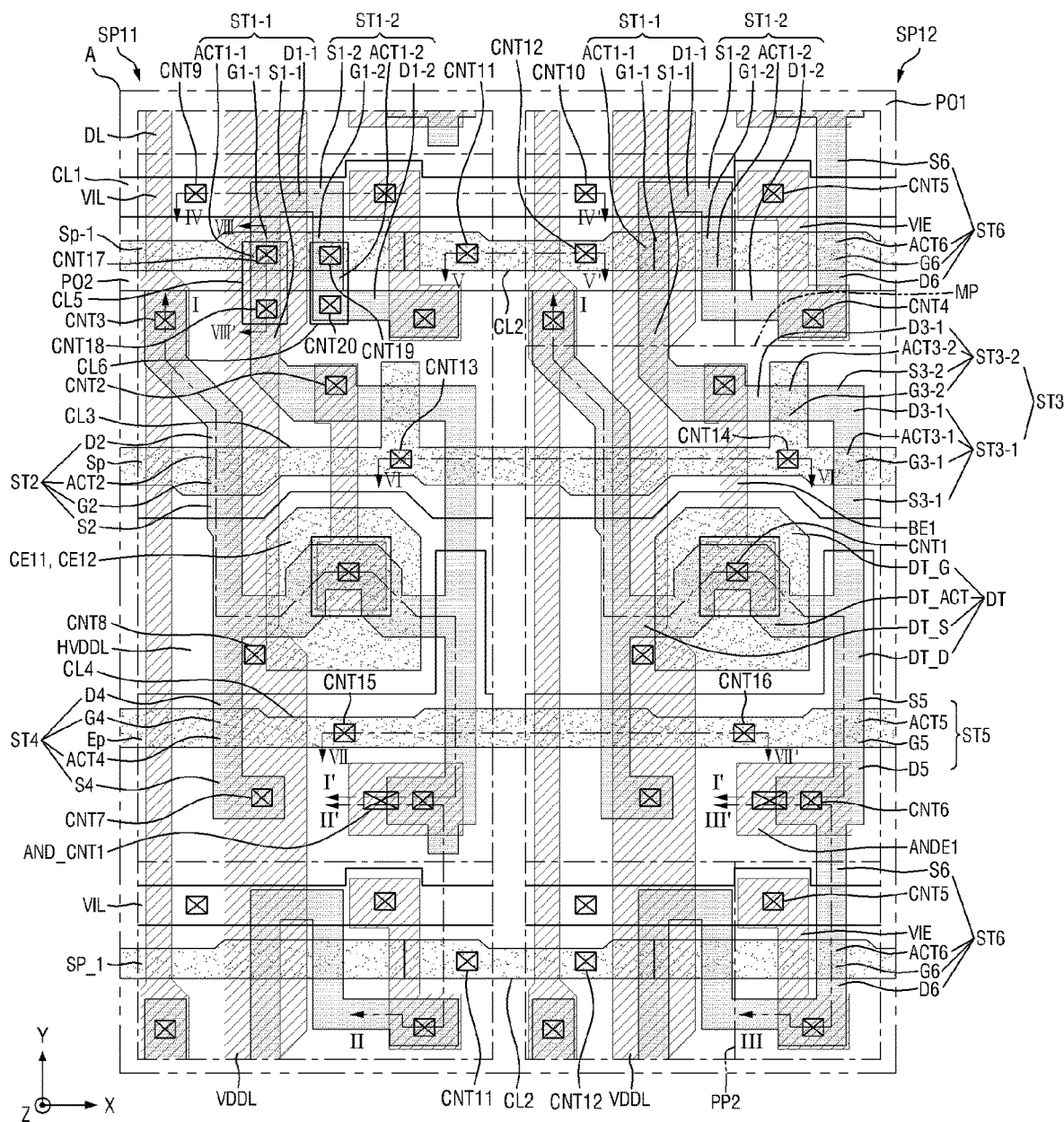
FIG. 7 is a plan view of area A of FIG. 5.

FIG. 7 is a plan view of area A of FIG. 5.

Referring to FIG. 7, a subpixel SP may include a driving transistor DT, first through sixth transistors ST1 through ST6, and a first capacitor C1.

The driving transistor DT may include an active layer DT_ACT, a gate electrode DT_G, a first electrode DT_S, and a second electrode DT_D. The active layer DT_ACT of the driving transistor DT may overlap the gate electrode DT_G of the driving transistor DT. The gate electrode DT_G of the driving transistor DT may be connected to a first connection electrode BE1 through a first contact hole CNT1. The first connection electrode BE1 may be connected to a first electrode S1-1 of a (1-1)th transistor ST1-1 and a drain electrode D3-2 of a (3-2)th transistor ST3-2 through a second contact hole CNT2. The first connection electrode BE1 may intersect or cross a pth scan line Sp. The first electrode DT_S of the driving transistor DT may be connected to a first electrode S2 of the second transistor ST2. The second electrode DT_D of the driving transistor DT may be connected to a first electrode S3-1 of a (3-1)th transistor ST3-1 and a first electrode S5 of the fifth transistor ST5.

The first transistor ST1 may be formed as a dual transistor. The first transistor ST1 may include the (1-1)th transistor ST1-1 and a (1-2)th transistor ST1-2.

The (1-1)th transistor ST1-1 may include an active layer ACT1-1, a gate electrode G1-1, the first electrode S1-1, and a second electrode D1-1. The gate electrode G1-1 of the (1-1)th transistor ST1-1 may be a part of a (p−1)th scan line Sp−1 and may be an overlap area between the active layer ACT1-1 of the (1-1)th transistor ST1-1 and the (p−1)th scan line Sp−1. The first electrode S1-1 of the (1-1)th transistor ST1-1 may be connected to the first connection electrode BE1 of the driving transistor DT through the second contact hole CNT2. The second electrode D1-1 of the (1-1)th transistor ST1-1 may be connected to a first electrode S1-2 of the (1-2)th transistor ST1-2.

The (1-2)th transistor ST1-2 may include an active layer ACT1-2, a gate electrode G1-2, the first electrode S1-2, and a second electrode D1-2. The gate electrode G1-2 of the (1-2)th transistor ST1-2 may be a part of the (p−1)th scan line Sp−1 and may be an overlap area between the active layer ACT1-2 of the (1-2)th transistor ST1-2 and the (p−1)th scan line Sp−1. The first electrode S1-2 of the (1-2)th transistor ST1-2 may be connected to the second electrode D1-1 of the (1-1)th transistor ST1-1. The second electrode D1-2 of the (1-2)th transistor ST1-2 may be connected to an initialization connection electrode VIE through a fourth contact hole CNT4.

The second transistor ST2 may include an active layer ACT2, a gate electrode G2, the first electrode S2, and a second electrode D2. The gate electrode G2 of the second transistor ST2 may be a part of the pth scan line Sp and may be an overlap area between the active layer ACT2 of the second transistor ST2 and the pth scan line Sp. The first electrode S2 of the second transistor ST2 may be connected to the first electrode DT_S of the driving transistor DT. The second electrode D2 of the second transistor ST2 may be connected to a jth data line Dj through a third contact hole CNT3.

The third transistor ST3 may be formed as a dual transistor. The first transistor ST1 may include the (3-1)th transistor ST3-1 and the (3-2)th transistor ST3-2.

The (3-1)th transistor ST3-1 may include an active layer ACT3-1, a gate electrode G3-1, the first electrode S3-1, and a second electrode D3-1. The gate electrode G3-1 of the (3-1)th transistor ST3-1 may be a part of the pth scan line Sp and may be an overlap area between the active layer ACT3-1 of the (3-1)th transistor ST3-1 and the pth scan line Sp. The first electrode S3-1 of the (3-1)th transistor ST3-1 may be connected to the second electrode DTD of the driving transistor DT. The second electrode D3-1 of the (3-1)th transistor ST3-1 may be connected to a first electrode S3-2 of the (3-2)th transistor ST3-2.

The (3-2)th transistor ST3-2 may include an active layer ACT3-2, a gate electrode G3-2, the first electrode S3-2, and the second electrode D3-2. The gate electrode G3-2 of the (3-2)th transistor ST3-2 may be a part of the pth scan line Sp and may be an overlap area between the active layer ACT3-2 of the (3-2)th transistor ST3-2 and the pth scan line Sp. The first electrode S3-2 of the (3-2)th transistor ST3-2 may be connected to the second electrode D3-1 of the (3-1)th transistor ST3-1. The second electrode D3-2 of the (3-2)th transistor ST3-2 may be connected to the first connection electrode BE1 through the second contact hole CNT2.

The fourth transistor ST4 may include an active layer ACT4, a gate electrode G4, a first electrode S4, and a second electrode D4. The gate electrode G4 of the fourth transistor ST4 may be a part of a pth emission line Ep and may be an overlap area between the active layer ACT4 of the fourth transistor ST4 and the pth emission line Ep. The first electrode S4 of the fourth transistor ST4 may be connected to a second electrode CE12 of the first capacitor C1 through a seventh contact hole CNT7. The second electrode D4 of the fourth transistor ST4 may be connected to the first electrode DT_S of the driving transistor DT.

The fifth transistor ST5 may include an active layer ACT5, a gate electrode G5, the first electrode S5, and a second electrode D5. The gate electrode G5 of the fifth transistor ST5 may be a part of the pth emission line Ep and may be an overlap area between the active layer ACT5 of the fifth transistor ST5 and the pth emission line Ep. The first electrode S5 of the fifth transistor ST5 may be connected to the second electrode DT_D of the driving transistor DT. The second electrode D5 of the fifth transistor ST5 may be connected to an anode AND of a light emitting element through a sixth contact hole CNT6.

A first electrode CE11 of the first capacitor C1 may be a part of the gate electrode DT_G of the driving transistor DT. The second electrode CE12 of the first capacitor C1 may be a part of a horizontal driving voltage line HVDDL connected to a first driving voltage line VDDL through an eighth contact hole CNT8. The first electrode CE11 and the second electrode CE12 may overlap each other.

Figure 8:
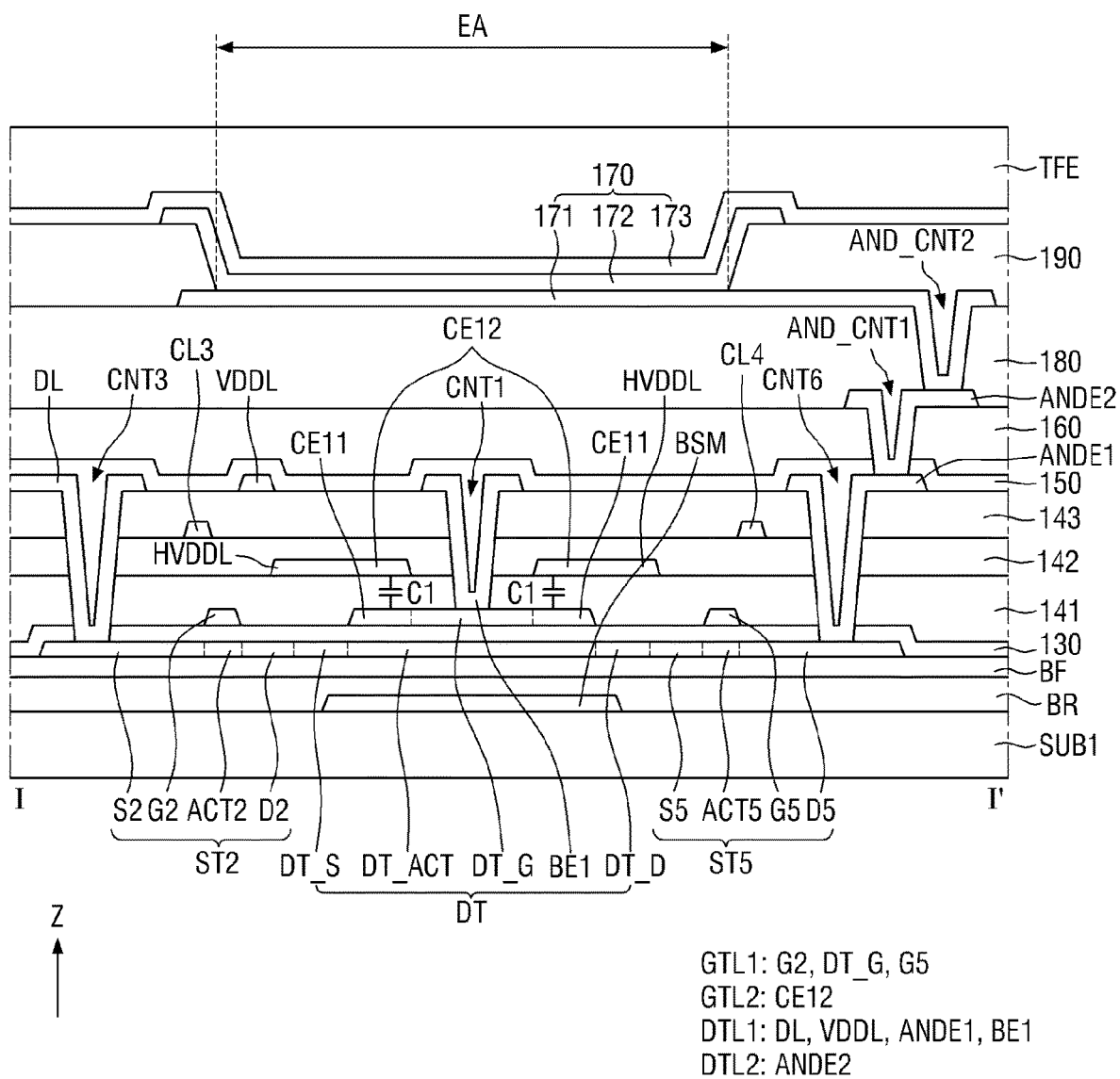
FIG. 8 is a schematic cross-sectional view taken along line I-I' of FIG. 7.

The sixth transistor ST6 may include an active layer ACT6, a gate electrode G6, a first electrode S6, and a second electrode D6. The gate electrode G6 of the sixth transistor ST6 may be a part of the pth scan line Sp and may be an overlap area between the active layer ACT6 of the sixth transistor ST6 and the pth scan line Sp. A first anode connection electrode ANDE1 may be connected to the first electrode S6 of the sixth transistor ST6 through the sixth contact hole CNT6. A second anode connection electrode ANDE2 may be connected to the first anode connection electrode ANDE1 through a first anode contact hole AND_CNT1 as illustrated in FIG. 8. A first electrode 171 of the light emitting element may be connected to the first anode connection electrode ANDE through a second anode contact hole AND_CNT2 as illustrated in FIG. 8. The second electrode D6 of the sixth transistor ST6 may be connected to the initialization connection electrode VIE through the fourth contact hole CNT4. An initialization voltage line VIL may be connected to the initialization connection electrode VIE through a fifth contact hole CNT5, and the initialization connection electrode VIE may be connected to the second electrode D1-2 of the (1-2)th transistor ST1-2 and the second electrode D6 of the sixth transistor ST6 through the fourth contact hole CNT4. The initialization connection electrode VIE may intersect or cross the pth scan line Sp.

Referring to FIG. 7, the extra-pixel bending area may be disposed between a first subpixel SP11 and a second subpixel SP12. The extra-pixel bending area may be disposed around each of the subpixels SP11 and SP12 and may surround or substantially surround each of the subpixels SP11 and SP12 in a plan view. The first bending organic layer PO1 may be disposed in the extra-pixel bending area as described above.

The intra-pixel bending area may be provided in each of the subpixels SP11 and SP12. The intra-pixel bending area may be disposed in each of the subpixels SP11 and SP12. The intra-pixel bending area may extend along the first direction (X-axis direction).

The display panel 300 may include a first connection line CL1 overlapping the initialization voltage line VIL, a second connection line CL2 overlapping the (p−1)th scan line Sp−1, a third connection line CL3 overlapping the pth scan line Sp, and a fourth connection line CL4 overlapping the pth emission line Ep. The first through fourth connection lines CL1 through CL4 may extend in the same direction as the initialization voltage line VIL, the (p−1)th scan line Sp−1, the pth scan line Sp, and the pth emission line Ep. It is to be understood that the connection lines may be referred to as intra-pixel connection lines or extra-pixel connection lines depending upon their location in the intra-pixel bending area or the extra-pixel bending area.

The connection lines CL1 through CL4 may be made of a different material from that of first and second gate layers GTL1 and GTL2 (see FIG. 8). For example, the first gate layer GTL1 may include molybdenum (Mo), and the connection lines CL1 through CL4 may include aluminum (Al). For example, the connection lines CL1 through CL4 may include a metal material that is more flexible than aluminum (Al).

The initialization voltage line VIL, the (p−1)th scan line Sp−1, the pth scan line Sp, and the pth emission line Ep may be interrupted by the first bending organic layer PO1 disposed between the first subpixel SP11 and the second subpixel SP12. Therefore, the connection lines CL1 through CL4 may electrically connect the initialization voltage line VIL, the (p−1)th scan line Sp−1, the pth scan line Sp, and the pth emission line Ep interrupted by the first bending organic layer PO1.

The first connection line CL1 may pass through the first subpixel SP11 and the second subpixel SP12. As illustrated in FIG. 7, the first connection line CL1 may electrically connect the interrupted initialization voltage line VIL through a ninth contact hole CNT9 and a tenth contact hole CNT10, the second connection line CL2 may electrically connect the interrupted (p−1)th scan line Sp−1 through an eleventh contact hole CNT11 and a twelfth contact hole CNT12, the third connection line CL3 may electrically connect the interrupted pth scan line Sp through a thirteenth contact hole CNT13 and a fourteenth contact hole CNT14, and the fourth connection line CL4 may electrically connect the interrupted pth emission line Ep through a fifteenth contact hole CNT15 and a sixteenth contact hole CNT16.

Each of the connection lines CL1 through CL4 may pass through the extra-pixel bending area.

The display panel 300 may further include a fifth connection line CL5 and a sixth connection line CL6 extending along the second direction (Y-axis direction) intersecting or crossing the extending direction of the intra-pixel bending area.

The fifth connection line CL5 may overlap the first electrode S1-1, the second electrode D1-1, and the active layer ACT1-1 of the (1-1)th transistor ST1-1.

The sixth connection line CL6 may overlap the first electrode S1-2, the second electrode D1-2, and the active layer ACT1-2 of the (1-2)th transistor ST1-2.

The connection lines CL5 and CL6 may include the same material as the connection lines CL1 through CL4 described above.

For example, the connection lines CL5 and CL6 may include a metal material that is more flexible than the material of the first gate layer GTL1.

Each of the first electrode S1-1 of the (1-1)th transistor ST1-1 and the first electrode S1-2 of the (1-2)th transistor ST1-2 may be interrupted by the second bending organic layer PO2 disposed in each of the subpixels SP11 and SP12. Therefore, the connection lines CL5 and CL6 may electrically connect the interrupted first electrode S1-1 of the (1-1)th transistor ST1-1 and the interrupted first electrode S1-2 of the (1-2)th transistor ST1-2, respectively.

The intra-pixel bending area may be disposed between the first transistor ST1-1 and ST1-2 and the third transistor ST3 in a plan view.

The fifth connection line CL5 may overlap the (p−1)th scan line Sp−1 and the first driving voltage line VDDL in the thickness direction. The sixth connection line CL6 may overlap the (p−1)th scan line Sp−1 in the thickness direction. Although the sixth connection line CL6 may not overlap the first driving voltage line VDDL in the thickness direction in the drawing, embodiments are not limited thereto, and the sixth connection line CL6 may also overlap the first driving voltage line VDDL in the thickness direction. The fifth and sixth connection lines CL5 and CL6 may be spaced apart from each other in the first direction (X-axis direction).

The fifth connection line CL5 may electrically connect the interrupted first electrode S1-1 of the (1-1)th transistor ST1-1 through a seventeenth contact hole CNT17 and an eighteenth contact hole CNT18, and the sixth connection line CL6 may electrically connect the interrupted first electrode S1-2 of the (1-2)th transistor ST1-2 through a nineteenth contact hole CNT19 and a twentieth contact hole CNT20, as illustrated in FIG. 7.

Figure 9:
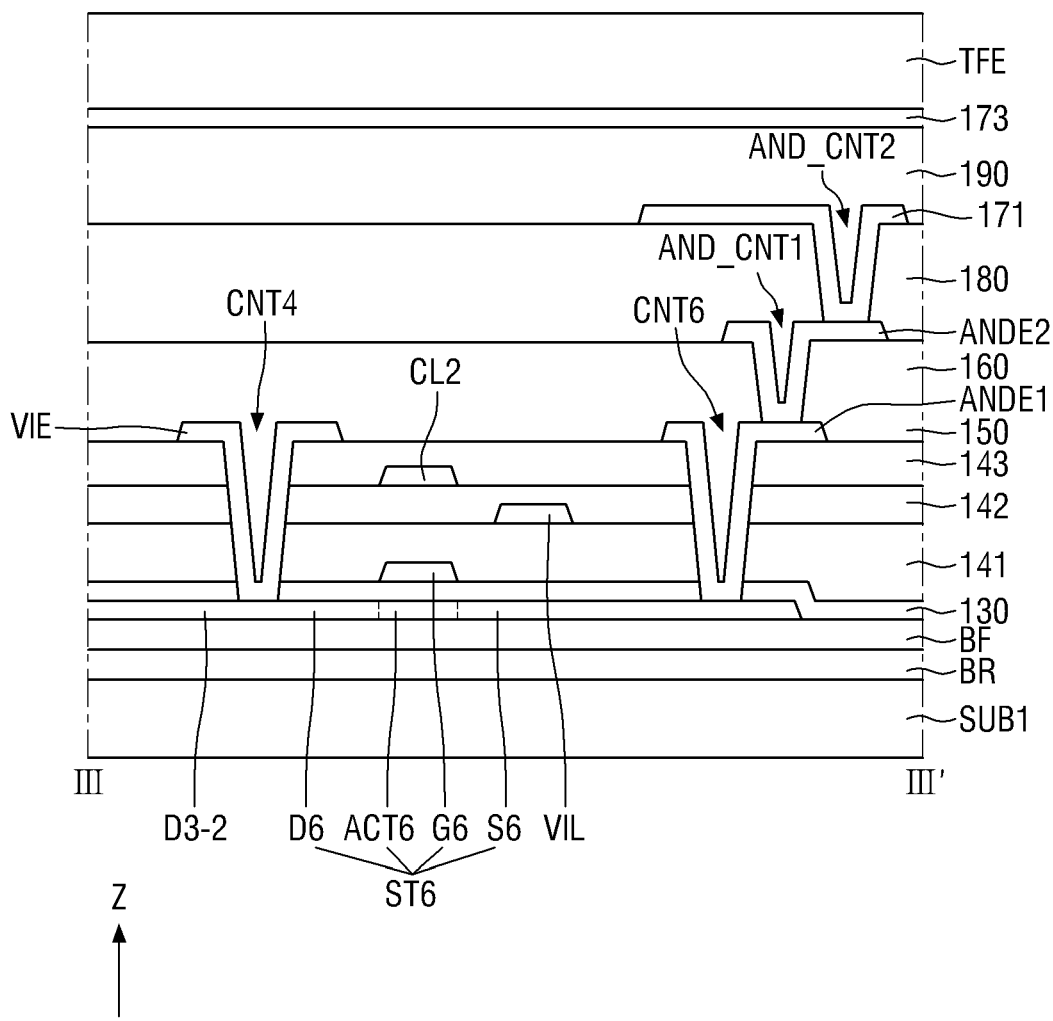
FIG. 9 is a schematic cross-sectional view taken along line of FIG. 7.
Figure 10:
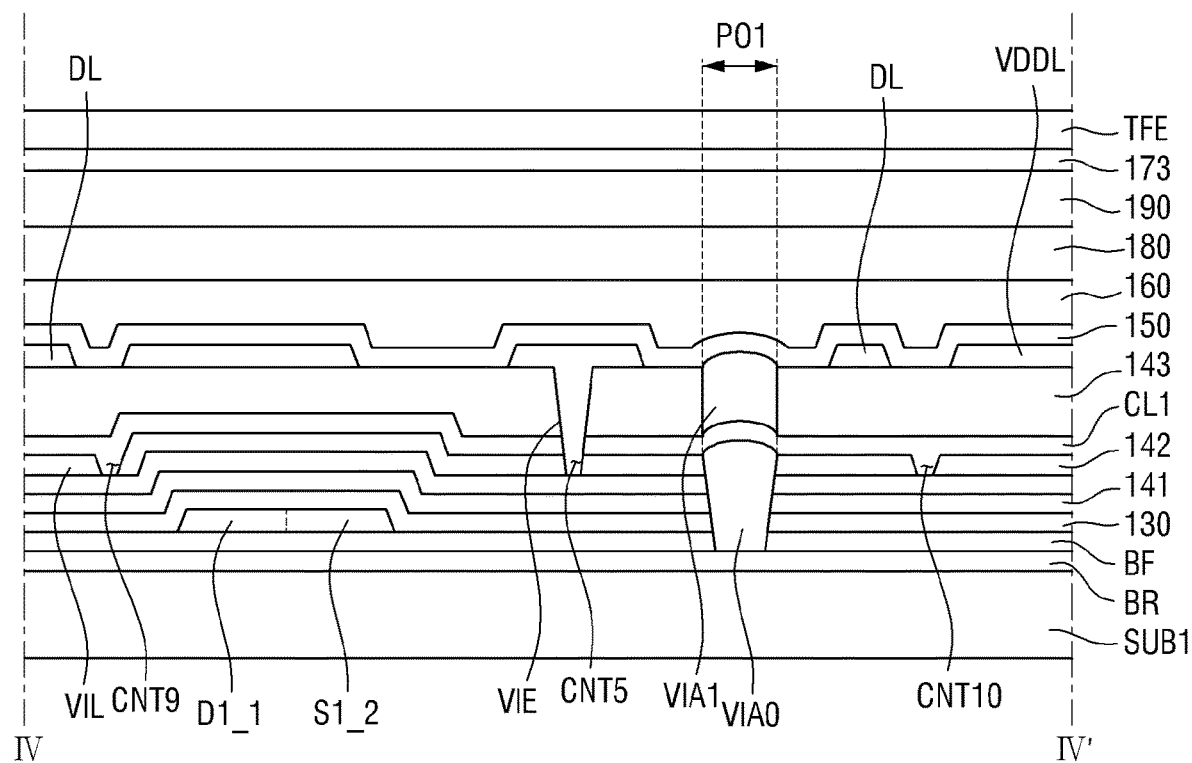
FIG. 10 is a schematic cross-sectional view taken along line IV-IV' of FIG. 7.
Figure 11:
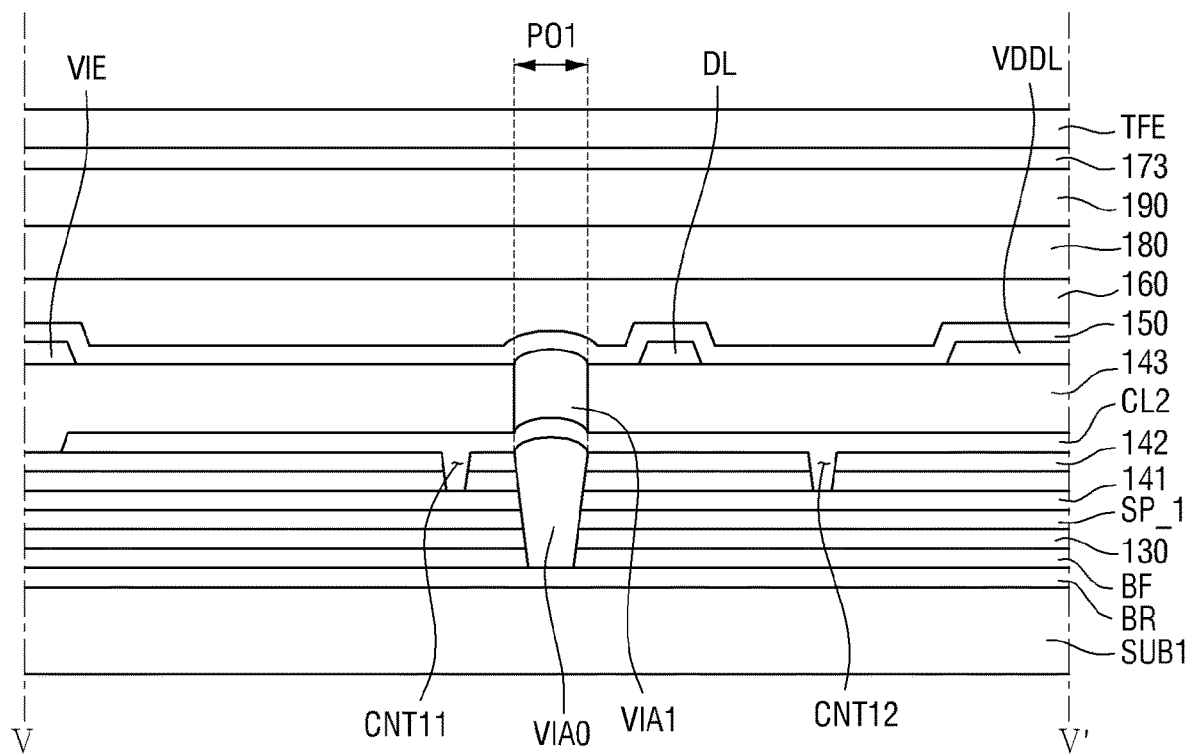
FIG. 11 is a schematic cross-sectional view taken along line V-V' of FIG. 7.
Figure 12:
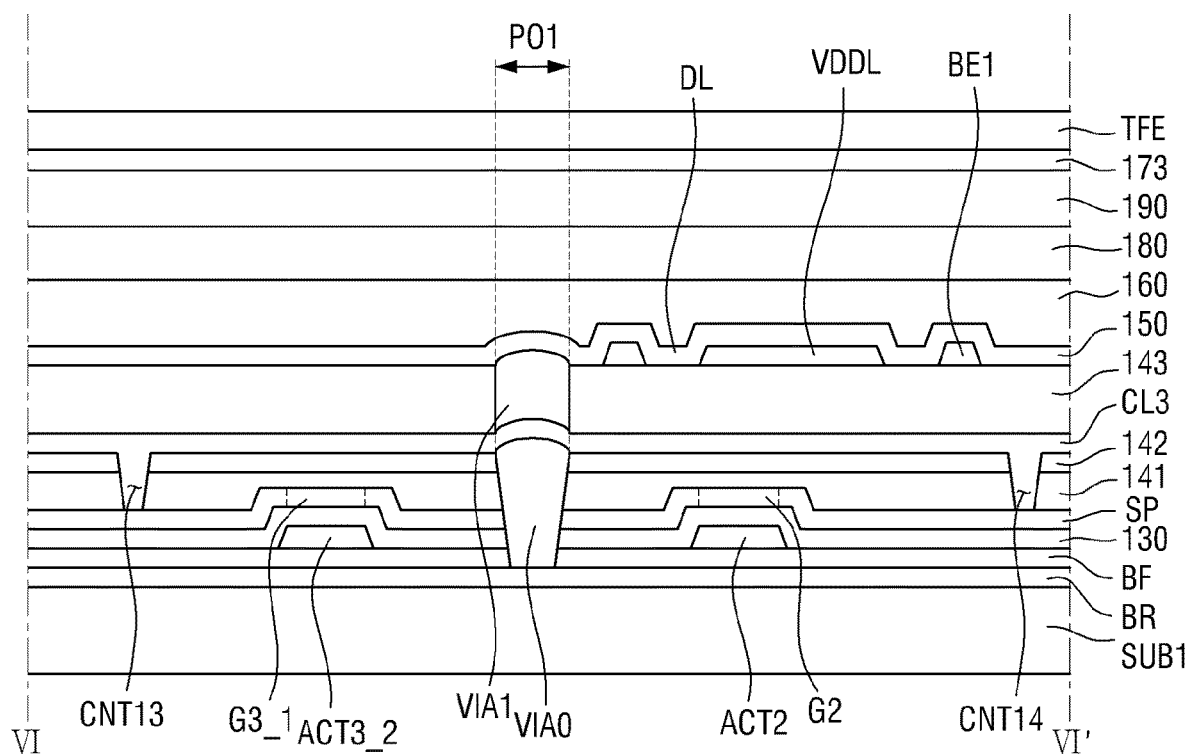
FIG. 12 is a schematic cross-sectional view taken along line VI-VI' of FIG. 7.
Figure 13:
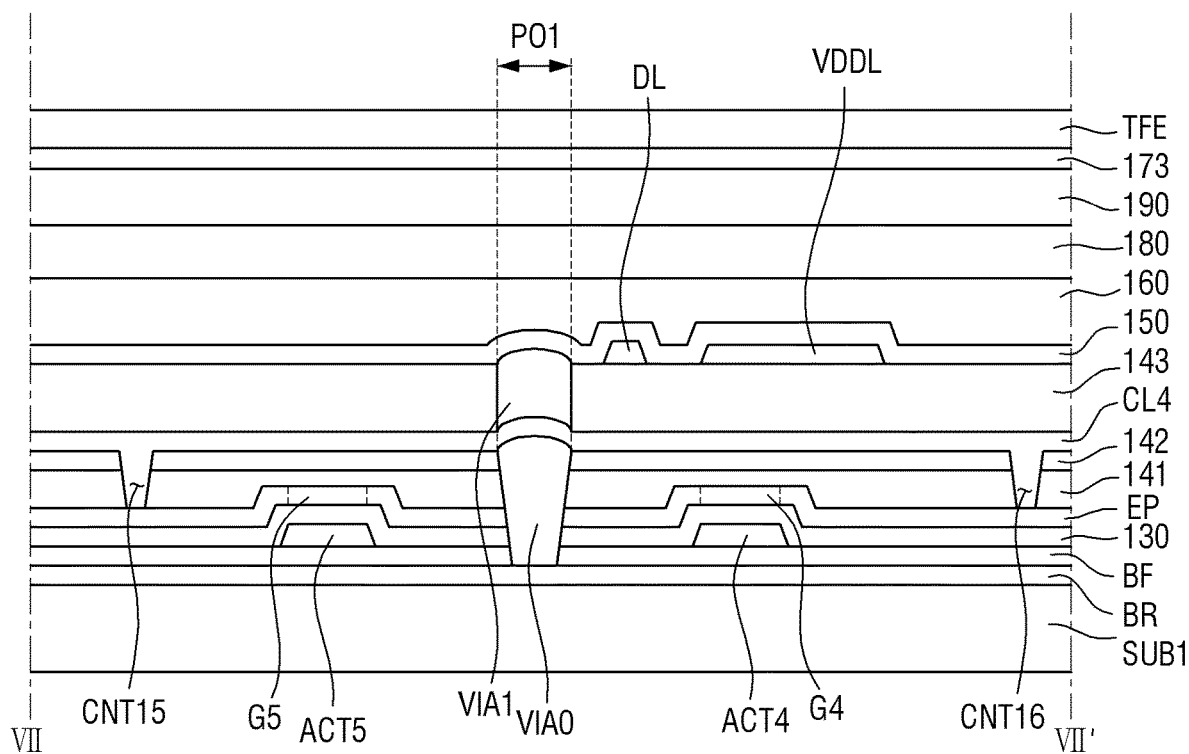
FIG. 13 is a schematic cross-sectional view taken along line VII-VII' of FIG. 7.
Figure 14:
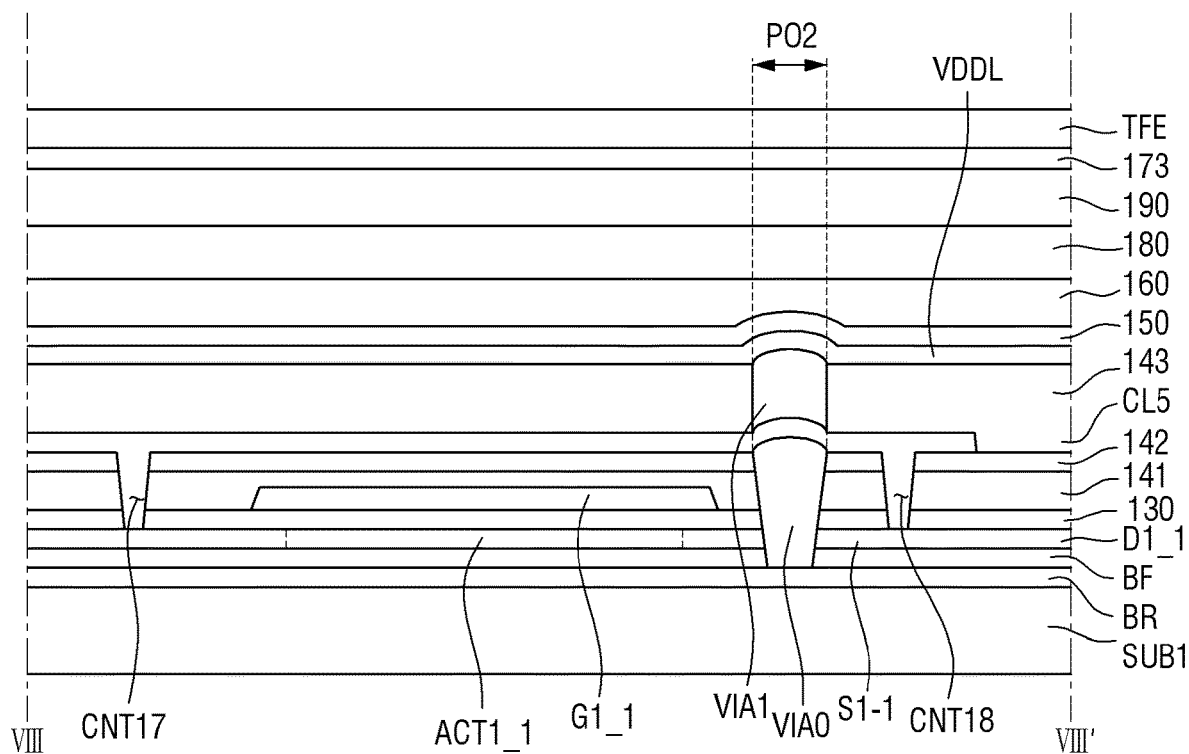
FIG. 14 is a schematic cross-sectional view taken along line VIII-VIII' of FIG. 7.
Figure 15:
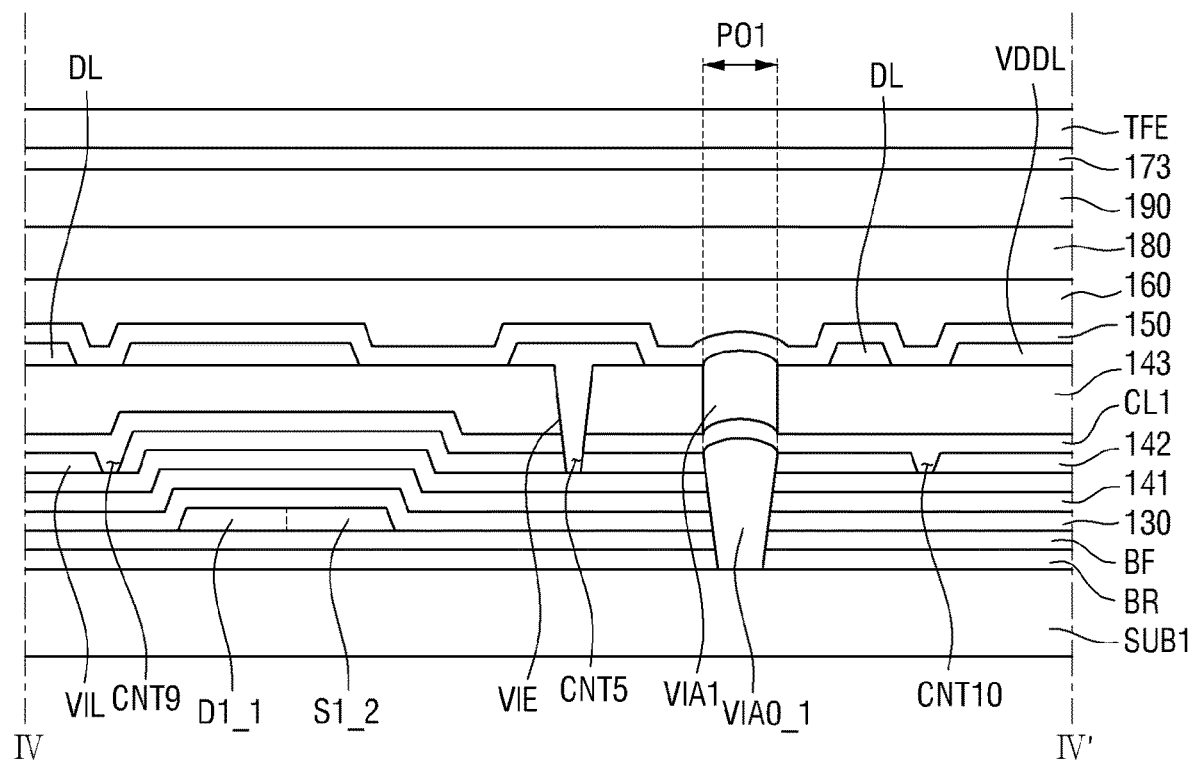
FIGS. 15 through 19 are schematic cross-sectional views of a display panel according to an embodiment.
Figure 16:
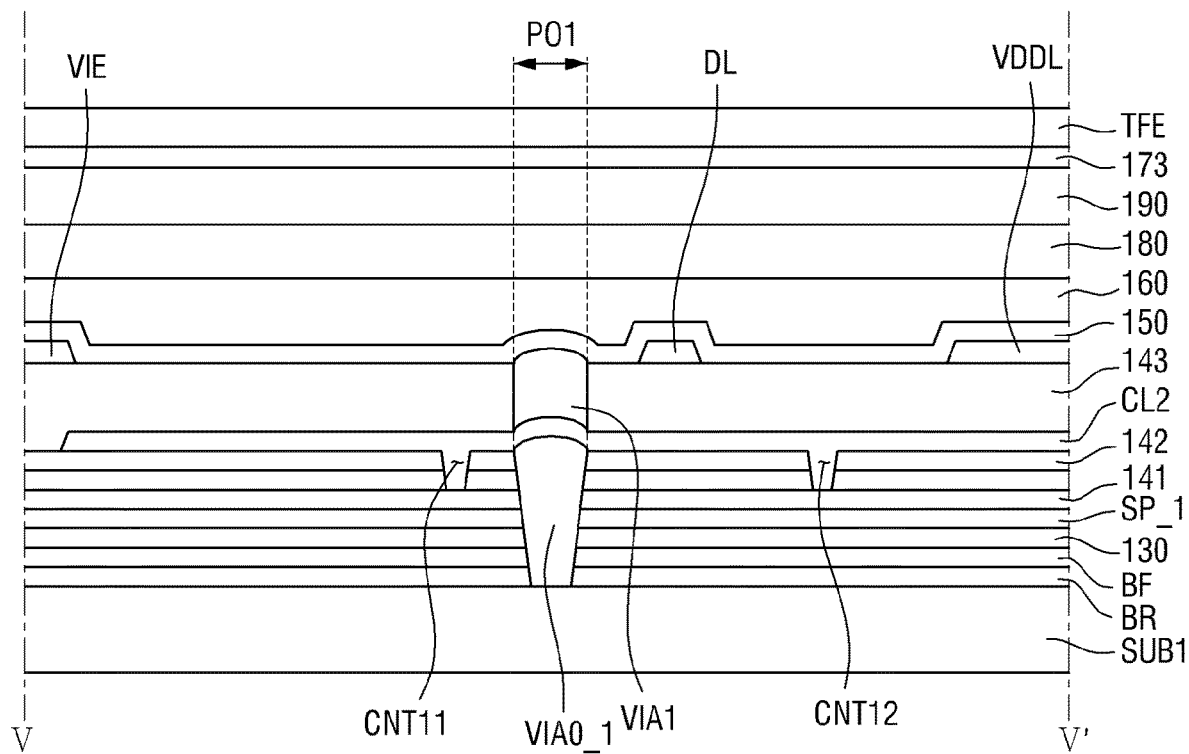
Figure 17:
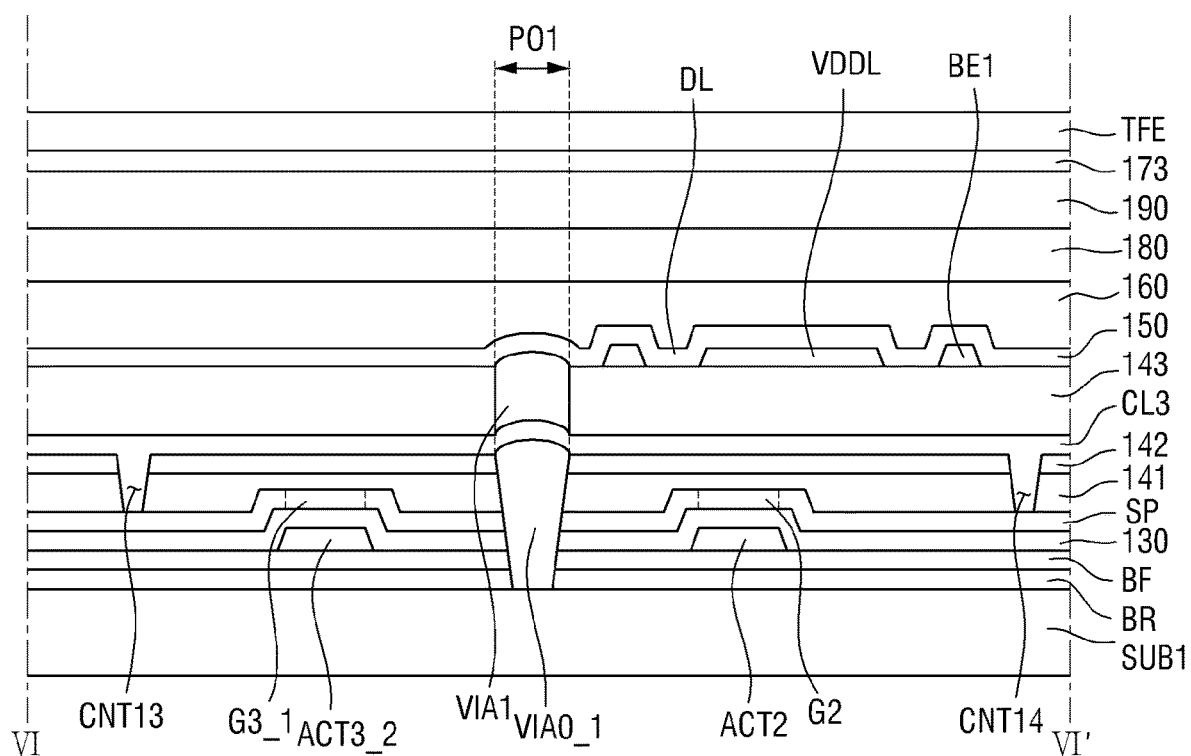
Figure 18:
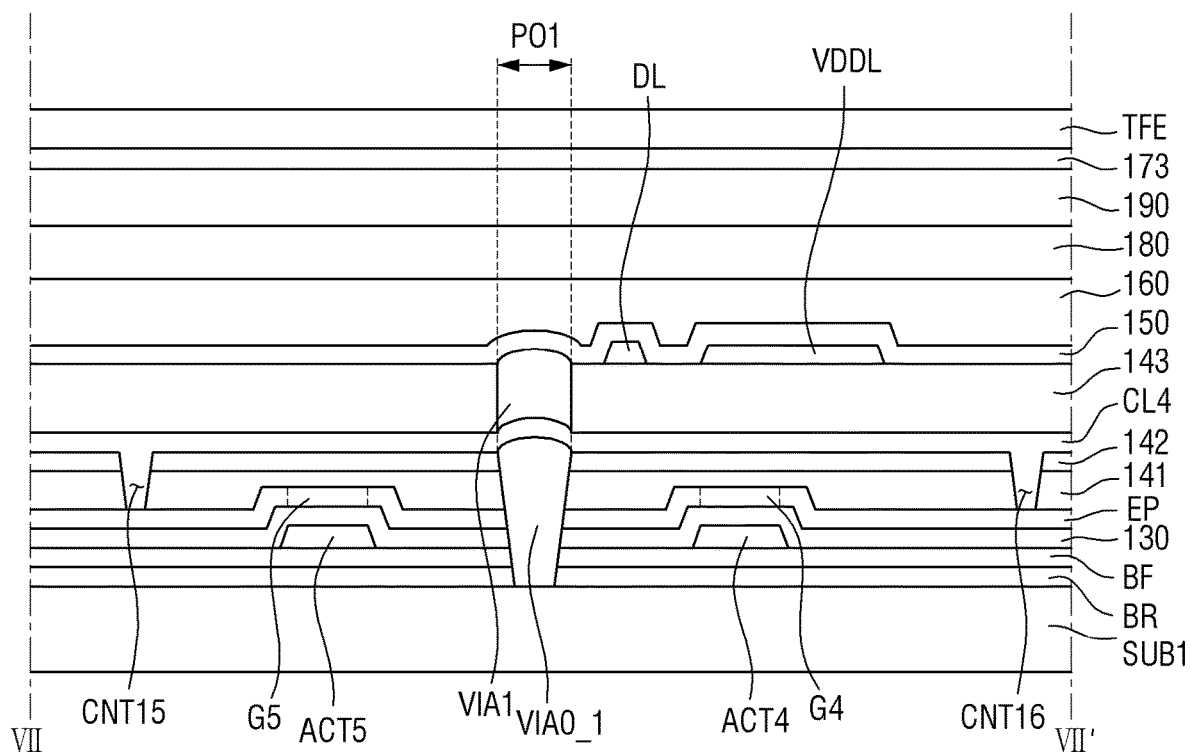
Figure 19:
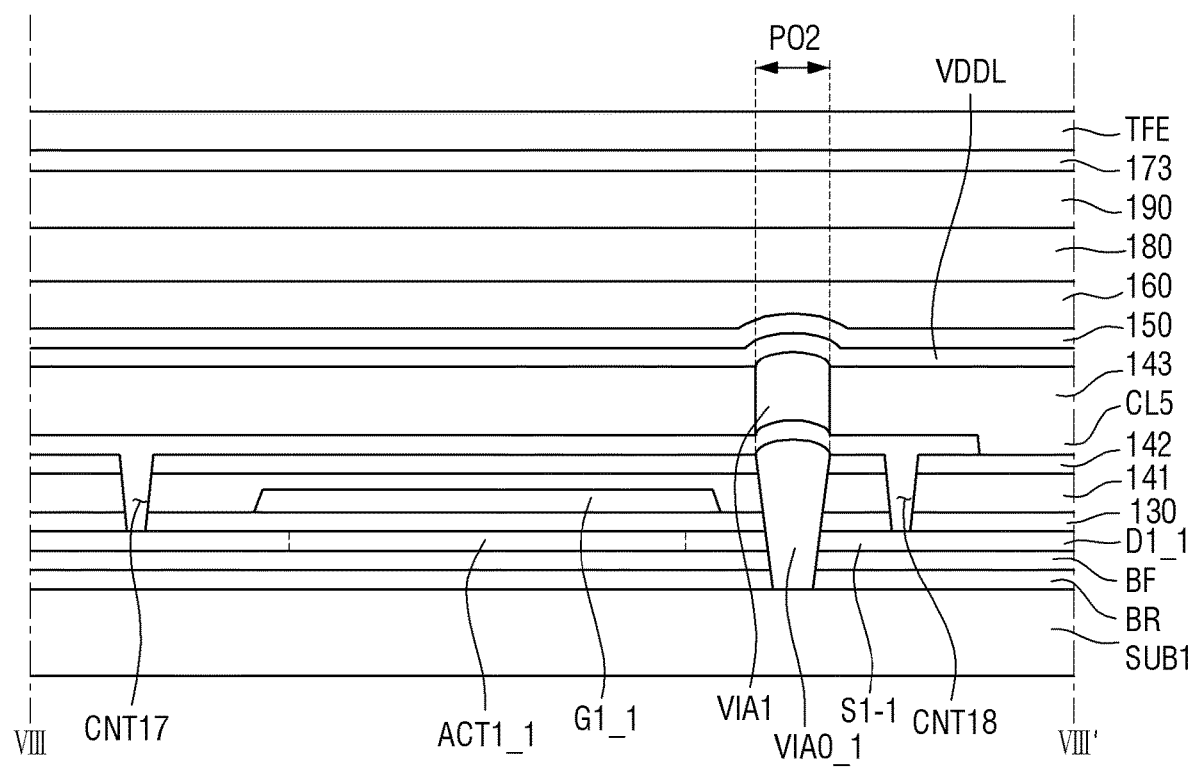

FIG. 8 is a schematic cross-sectional view taken along line I-I' of FIG. 7. FIG. 9 is a schematic cross-sectional view taken along line of FIG. 7. FIG. 10 is a schematic cross-sectional view taken along line IV-IV' of FIG. 7. FIG. 11 is a schematic cross-sectional view taken along line V-V' of FIG. 7. FIG. 12 is a schematic cross-sectional view taken along line VI-VI' of FIG. 7. FIG. 13 is a schematic cross-sectional view taken along line VII-VII' of FIG. 7. FIG. 14 is a schematic cross-sectional view taken along line VIII-VIII' of FIG. 7.

Referring to FIGS. 8 through 14, a thin-film transistor layer TFTL, a light emitting element layer EML, and an encapsulation layer TFE may be sequentially formed on a first substrate SUB1.

The thin-film transistor layer TFTL may include a light shielding layer BSM a barrier layer BR, a buffer layer BF, an active layer ACT, the first gate layer GTL1, the second layer GTL2, a third gate layer, a first source metal layer DTL1, a second source metal layer DTL2, a gate insulating layer 130, a first interlayer insulating film 141, a second interlayer insulating film 142, a third interlayer insulating film 143, a protective layer 150, a first planarization layer 160, and a second planarization layer 180.

The light shielding layer BSM may be formed on a surface of the first substrate SUB1. The light shielding layer BSM may overlap the active layer DT_ACT of the driving transistor DT to prevent generation of leakage current due to light incident on the active layer DT_ACT of the driving transistor DT. Although the light shielding layer BSM may overlap only the active layer DT_ACT of the driving transistor DT, embodiments are not limited thereto. For example, the light shielding layer BSM may overlap not only the active layer DT_ACT of the driving transistor DT but also the active layers ACT1 through ACT6 of the first through sixth transistors ST1 through ST6. The light shielding layer BSM may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The barrier layer BR may be formed on the light shielding layer BSM. The barrier layer BR may be a multilayer in which one or more inorganic layers selected from a silicon nitride layer, a silicon oxynitride layer, a silicon oxide layer, a titanium oxide layer, and an aluminum oxide layer are stacked (for example, alternately stacked). The barrier layer BR may be omitted in other embodiments.

The buffer layer BF may be formed on the barrier layer BR. The buffer layer BF may be formed on the surface of the first substrate SUB1 to protect thin-film transistors and an organic light emitting layer 172 of the light emitting element layer EML from moisture introduced through the first substrate SUB1 which is vulnerable to moisture penetration. The buffer layer BF may be composed of inorganic layers. For example, the buffer layer BF may be a multilayer in which one or more inorganic layers selected from a silicon nitride layer, a silicon oxynitride layer, a silicon oxide layer, a titanium oxide layer, and an aluminum oxide layer are stacked (for example, alternately stacked). The buffer layer BF may be omitted in other embodiments.

The active layer ACT may be formed on the first substrate SUB1 or the barrier layer BR. The active layer ACT may include polycrystalline silicon, monocrystalline silicon, low-temperature polycrystalline silicon, amorphous silicon, or an oxide semiconductor. When the active layer ACT is made of polycrystalline silicon, the active layer ACT doped with ions may have conductivity. Therefore, the active layer ACT may include not only the active layers DT_ACT and ACT1 through ACT6 of the driving transistor DT and the first through sixth transistors ST1 through ST6 of each of the first and second subpixels SP11 and SP12 but also the source electrodes DT_S, S1, S2-1, S2-2, S3-1, S3-2, S4, S5 and S6 and the drain electrodes DT_D, D1-2, D1-2, D2-1, D2-2, D3-1, D3-2, D4, D5 and D6.

The gate insulating layer 130 may be formed on the active layer ACT. The gate insulating layer 130 may be an inorganic layer, for example, a silicon nitride layer, a silicon oxynitride layer, a silicon oxide layer, a titanium oxide layer, or an aluminum oxide layer.

The first gate layer GTL1 may be formed on the gate insulating layer 130. The first gate layer GTL1 may include not only the gate electrode DT_G of the driving transistor DT and the gate electrodes G1 through G6 of the first through sixth transistors ST1 through ST6 of each of the first and second subpixels SP11 and SP12 but also the scan lines SL and the emission lines ECL. The first gate layer GTL1 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same. For example, the first gate layer GTL1 may include molybdenum (Mo).

The first interlayer insulating film 141 may be formed on the first gate layer GTL1. The first interlayer insulating film 141 may be an inorganic layer, for example, a silicon nitride layer, a silicon oxynitride layer, a silicon oxide layer, a titanium oxide layer, or an aluminum oxide layer. The first interlayer insulating film 141 may include inorganic layers.

The second gate layer GTL2 may be formed on the first interlayer insulating film 141. The second gate layer GTL2 may include the initialization voltage line VIL and the second electrode CE12 of the first capacitor C1. The second gate layer GTL2 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same. For example, the second gate layer GTL2 may include molybdenum (Mo).

The second interlayer insulating film 142 may be formed on the second gate layer GTL2. The second interlayer insulating film 142 may be an inorganic layer, for example, a silicon nitride layer, a silicon oxynitride layer, a silicon oxide layer, a titanium oxide layer, or an aluminum oxide layer. The second interlayer insulating film 142 may include inorganic layers.

The connection lines CL1 through CL6 may be disposed on the second interlayer insulating film 142. The connection lines CL1 through CL6 may include a conductive material that is more flexible than the first gate layer GTL1 described above. For example, the connection lines CL1 through CL6 may include aluminum (Al).

The third interlayer insulating film 143 may be disposed on the connection lines CL1 through CL6. The third interlayer insulating film 143 may be an inorganic layer, for example, a silicon nitride layer, a silicon oxynitride layer, a silicon oxide layer, a titanium oxide layer, or an aluminum oxide layer. The third interlayer insulating film 143 may include inorganic layers.

The first source metal layer DTL1 may be formed on the third interlayer insulating film 143. The first source metal layer DTL1 may include the data lines DL, the first driving voltage lines VDDL, the first connection electrode BE1, the first anode connection electrode ANDE1, and the initialization connection electrode VIE. The first source metal layer DTL1 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The first planarization layer 160 may be formed on the first source metal layer DTL1 to planarize steps due to the active layer ACT, the first gate layer GTL1, the second gate layer GTL2, and the first source metal layer DTL1. The first planarization layer 160 may be made of an organic layer such as acryl resin, epoxy resin, phenolic resin, polyamide resin, or polyimide resin.

The protective layer 150 may be formed between the first source metal layer DTL1 and the first planarization layer 160. The protective layer 150 may be an inorganic layer, for example, a silicon nitride layer, a silicon oxynitride layer, a silicon oxide layer, a titanium oxide layer, or an aluminum oxide layer.

The second source metal layer DTL2 may be formed on the first planarization layer 160. The second source metal layer DTL2 may include the second anode connection electrode ANDE2. The second source metal layer DTL2 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The second planarization layer 180 may be formed on the second source metal layer DTL2. The second planarization layer 180 may be made of an organic layer such as acryl resin, epoxy resin, phenolic resin, polyamide resin, or polyimide resin.

Although a case where each of the driving transistor DT and the first through sixth transistors ST1 through ST6 of each subpixel SP is formed as a top-gate type in which a gate electrode is located above an active layer, it should be noted that embodiments are not limited thereto. For example, each of the driving transistor DT and the first through sixth transistors ST1 through ST6 of each subpixel SP may also be formed as a bottom-gate type in which the gate electrode is located under the active layer or a double-gate type in which the gate electrode is located both above and under the active layer.

The first contact hole CNT1 may penetrate the first through third interlayer insulating films 141 through 143 to expose the gate electrode DT_G of the driving transistor DT. The first connection electrode BE1 may be connected to the gate electrode DT_G of the driving transistor DT through the first contact hole CNT1.

The second contact hole CNT2 may penetrate the gate insulating layer 130 and the first through third interlayer insulating films 141 through 143 to expose the first electrode S1-1 of the (1-1)th transistor ST1-1 and the second electrode D3-1 of the (3-1)th transistor ST3-1. A second connection electrode BE2 may be connected to the first electrode S1-1 of the (1-1)th transistor ST1-1 and the second electrode D3-1 of the (3-1)th transistor ST3-1 through the second contact hole CNT2.

The third contact hole CNT3 may penetrate the gate insulating layer 130 and the first through third interlayer insulating films 141 through 143 to expose the first electrode S2 of the second transistor ST2. A data line DL may be connected to the first electrode S2 of the second transistor ST2 through the third contact hole CNT3.

The fourth contact hole CNT4 may penetrate the gate insulating layer 130 and the first through third interlayer insulating films 141 through 143 to expose the second electrode D1 of the first transistor ST1 and the second electrode D4 of the fourth transistor ST4. The initialization connection electrode VIE may be connected to the (1-2)th (second) electrode D1-2 of the (1-2)th transistor ST1-2 (the second electrode D3-2 of the (3-2)th transistor ST3-2 and the second electrode D4 of the fourth transistor ST4 through the fourth contact hole CNT4.

The fifth contact hole CNT5 may penetrate the second interlayer insulating film 142 and the third interlayer insulating film 143 to expose the initialization voltage line VIL. The initialization connection electrode VIE may be connected to the initialization voltage line VIL through the fifth contact hole CNT5.

The sixth contact hole CNT6 may penetrate the gate insulating layer 130 and the first through third interlayer insulating films 141 through 143 to expose the second electrode D5 of the fifth transistor ST5. The first anode connection electrode ANDE1 may be connected to the second electrode D5 of the fifth transistor ST5 through the sixth contact hole CNT6.

The seventh contact hole CNT7 may penetrate the gate insulating layer 130 and the first through third interlayer insulating films 141 through 143 to expose the first electrode S4 of the fourth transistor ST4. A first driving voltage line VDDL may be connected to the first electrode S4 of the fourth transistor ST4 through the seventh contact hole CNT7.

The eighth contact hole CNT8 may penetrate the second interlayer insulating film 142 and the third interlayer insulating film 143 to expose the horizontal driving voltage line HVDDL. The first driving voltage line VDDL1 may be connected to the horizontal driving voltage line HVDDL through the eighth contact hole CNT8.

The first anode contact hole AND_CNT1 may penetrate the protective layer 150 and the first planarization layer 160 to expose the first anode connection electrode ANDE1.

The second anode contact hole AND_CNT2 may penetrate the second planarization layer 180 to expose the second anode connection electrode ANDE2.

The light emitting element layer EML may be formed on the thin-film transistor layer TFTL. The light emitting element layer EML may include light emitting elements 170 and a pixel defining layer 190.

The light emitting elements 170 and the pixel defining layer 190 may be formed on the planarization layer 160. Each of the light emitting elements 170 may include the first electrode 171, the organic light emitting layer 172, and a second electrode 173.

The first electrode 171 may be formed on the second planarization layer 180. The first electrode 171 may be connected to the second anode connection electrode ANDE2 through the second anode contact hole AND_CNT2 penetrating the second planarization layer 180.

In a top emission structure in which light may be emitted from the organic light emitting layer 172 toward the second electrode 173, the first electrode 171 may be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy may be an alloy of silver (Ag), palladium (Pd), and copper (Cu).

The pixel defining layer 190 may be formed on the second planarization layer 180 to separate the first electrode 171 from other first electrodes 171 in order to define a light emitting area EA of each of the first and second subpixels SP11 and SP12. The pixel defining layer 190 may be formed to cover edges of each first electrode 171. The pixel defining layer 190 may be made of an organic layer such as acryl resin, epoxy resin, phenolic resin, polyamide resin, or polyimide resin.

The light emitting area EA of each subpixel SP may be an area in which the first electrode 171, the organic light emitting layer 172, and the second electrode 173 are sequentially stacked so that holes from the first electrode 171 and electrons from the second electrode 173 combine together in the organic light emitting layer 172 to emit light.

The organic light emitting layer 172 may be formed on the first electrode 171 and the pixel defining layer 190. The organic light emitting layer 172 may include an organic material to emit light of a predetermined color. For example, the organic light emitting layer 172 may include a hole transporting layer, an organic material layer, and an electron transporting layer.

The second electrode 173 may be formed on the organic light emitting layer 172. The second electrode 173 may be formed to cover the organic light emitting layer 172. The second electrode 173 may be a common layer common to all subpixels SP1 through SP3. A capping layer may be formed on the second electrode 173.

In the top emission structure, the second electrode 173 may be made of a transparent conductive material (TCO) capable of transmitting light, such as indium tin oxide (ITO) or indium zinc oxide (IZO), or a semi-transmissive conductive material such as magnesium (Mg), silver (Ag) or an alloy of Mg and Ag. When the second electrode 173 is made of a semi-transmissive conductive material, the light output efficiency may be increased by a microcavity.

The encapsulation layer TFE may be formed on the light emitting element layer EML. The encapsulation layer TFE may include at least one inorganic layer to prevent oxygen or moisture from penetrating into the light emitting element layer EML. For example, the encapsulation layer TFE may include at least one organic layer to protect the light emitting element layer EML from foreign substances such as dust.

A second substrate may be disposed on the light emitting element layer EML instead of the encapsulation layer TFE, and a space between the light emitting element layer EML and the second substrate may be empty such as a vacuum, or a filling film may be disposed in the space. The filling film may be an epoxy filling film or a silicone filling film.

Referring to FIG. 8, the third connection line CL3 may overlap the second active layer ACT2 and the second gate electrode G2 of the second transistor ST2 in the thickness direction, and the fourth connection line CL4 may overlap the fifth active layer ACT5 and the fifth gate electrode G5 of the fifth transistor ST5 in the thickness direction.

Referring to FIG. 9, the second connection line CL2 may overlap the sixth active layer ACT6 and the sixth gate electrode G6 of the sixth transistor ST6 in the thickness direction.

Referring to FIG. 10, the first bending organic layer PO1 may be disposed on the barrier layer BR in the extra-pixel bending area. The first bending organic layer PO1 may include a (1-1)th organic layer VIA0 and a (1-2)th organic layer VIA1 disposed on the (1-1)th organic layer VIA0. The (1-1)th organic layer VIA0 may be disposed on the barrier layer BR and penetrate the second interlayer insulating film 142, the initialization voltage line VIL, the first interlayer insulating film 141, the gate insulating layer 130, and the buffer layer BF.

For example, in the extra-pixel bending area, the initialization voltage line VIL may be interrupted by the (1-1)th organic layer VIA0. For example, in the extra-pixel bending area, the second interlayer insulating film 142, the initialization voltage line VIL, the first interlayer insulating film 141, the gate insulating layer 130, and the buffer layer BF may be penetrated by the (1-1)th organic layer VIA0. The (1-1)th organic layer VIA0 may contact (for example, directly contact) an upper surface of the barrier layer BR.

The first connection line CL1 may be disposed on the (1-1)th organic layer VIA0. The first connection line CL1 may be electrically connected to the initialization voltage line VIL thereunder through the contact holes CNT9 and CNT10 penetrating the second interlayer insulating film 142. For example, the initialization voltage line VIL interrupted by the (1-1)th organic layer VIA0 in the extra-pixel bending area may be electrically connected by the first connection line CL1.

In the extra-pixel bending area, the (1-2)th organic layer VIA1 may be disposed on the first connection line CL1. The (1-2)th organic layer VIA1 may penetrate the third interlayer insulating film 143 in the thickness direction.

The protective layer 150 may be further disposed on the (1-2)th organic layer VIA1.

Referring to FIG. 11, the (1-1)th organic layer VIA0 may be disposed on the barrier layer BR and may penetrate the second interlayer insulating film 142, the first interlayer insulating film 141, the (p−1)th scan line Sp−1, the gate insulating layer 130, and the buffer layer BF.

For example, in the extra-pixel bending area, the (p−1)th scan line Sp−1 may be interrupted by the (1-1)th organic layer VIA0. For example, in the extra-pixel bending area, the second interlayer insulating film 142, the (p−1)th scan line Sp−1, the first interlayer insulating film 141, the gate insulating layer 130, and the buffer layer BF may be penetrated by the (1-1)th organic layer VIA0. The (1-1)th organic layer VIA0 may contact (for example, directly contact) the upper surface of the barrier layer BR.

The second connection line CL2 may be disposed on the (1-1)th organic layer VIA0. The second connection line CL2 may be electrically connected to the (p−1)th scan line Sp−1 thereunder through the contact holes CNT11 and CNT12 penetrating the second interlayer insulating film 142 and the first interlayer insulating film 141. For example, the (p−1)th scan line Sp−1 interrupted by the (1-1)th organic layer VIA0 in the extra-pixel bending area may be electrically connected by the second connection line CL2.

In the extra-pixel bending area, the (1-2)th organic layer VIA1 may be disposed on the second connection line CL2. The (1-2)th organic layer VIA1 may penetrate the third interlayer insulating film 143 in the thickness direction.

The protective layer 150 may be further disposed on the (1-2)th organic layer VIA1.

Referring to FIG. 12, the (1-1)th organic layer VIA0 may be disposed on the barrier layer BR and may penetrate the second interlayer insulating film 142, the first interlayer insulating film 141, the pth scan line Sp, the gate insulating layer 130, and the buffer layer BF.

For example, in the extra-pixel bending area, the pth scan line Sp may be interrupted by the (1-1)th organic layer VIA0. In the extra-pixel bending area, the second interlayer insulating film 142, the pth scan line Sp, the first interlayer insulating film 141, the gate insulating layer 130, and the buffer layer BF may be penetrated by the (1-1)th organic layer VIA0. The (1-1)th organic layer VIA0 may contact (for example, directly contact) the upper surface of the barrier layer BR.

The third connection line CL3 may be disposed on the (1-1)th organic layer VIA0. The third connection line CL3 may be electrically connected to the pth scan line Sp thereunder through the contact holes CNT13 and CNT14 penetrating the second interlayer insulating film 142 and the first interlayer insulating film 141. For example, the pth scan line Sp interrupted by the (1-1)th organic layer VIA0 in the extra-pixel bending area may be electrically connected by the third connection line CL3.

In the extra-pixel bending area, the (1-2)th organic layer VIA1 may be disposed on the third connection line CL3. The (1-2)th organic layer VIA1 may penetrate the third interlayer insulating film 143 in the thickness direction.

The protective layer 150 may be disposed on the (1-2)th organic layer VIA1.

Referring to FIG. 13, the (1-1)th organic layer VIA0 may be disposed on the barrier layer BR and may penetrate the second interlayer insulating film 142, the first interlayer insulating film 141, the pth emission line Ep, the gate insulating layer 130, and the buffer layer BF.

For example, in the extra-pixel bending area, the pth emission line Ep may be interrupted by the (1-1)th organic layer VIA0. In the extra-pixel bending area, the second interlayer insulating film 142, the pth emission line Ep, the first interlayer insulating film 141, the gate insulating layer 130, and the buffer layer BF may be penetrated by the (1-1)th organic layer VIA0. The (1-1)th organic layer VIA0 may contact (for example, directly contact) the upper surface of the barrier layer BR.

The fourth connection line CL4 may be disposed on the (1-1)th organic layer VIA0. The fourth connection line CL4 may be electrically connected to the pth emission line Ep thereunder through the contact holes CNT15 and CNT16 penetrating the second interlayer insulating film 142 and the first interlayer insulating film 141. For example, the pth emission line Ep interrupted by the (1-1)th organic layer VIA0 in the extra-pixel bending area may be electrically connected by the fourth connection line CL4.

In the extra-pixel bending area, the (1-2)th organic layer VIA1 may be disposed on the fourth connection line CL4. The (1-2)th organic layer VIA1 may penetrate the third interlayer insulating film 143 in the thickness direction.

The protective layer 150 may be further disposed on the (1-2)th organic layer VIA1.

Referring to FIG. 14, the (1-1)th organic layer VIA0 may be disposed on the barrier layer BR and may penetrate the second interlayer insulating film 142, the first interlayer insulating film 141, the gate insulating layer 130, the first electrode S1-1 of the semiconductor layer of the (1-1)th transistor ST1-1, and the buffer layer BF.

For example, in the intra-pixel bending area, the first electrode S1-1 of the semiconductor layer of the (1-1)th transistor ST1-1 may be interrupted by the (1-1)th organic layer VIA0. In the intra-pixel bending area, the second interlayer insulating film 142, the first interlayer insulating film 141, the gate insulating layer 130, the first electrode S1-1 of the semiconductor layer of the (1-1)th transistor ST1-1, and the buffer layer BF may be penetrated by the (1-1)th organic layer VIA0. The (1-1)th organic layer VIA0 may contact (for example, directly contact) the upper surface of the barrier layer BR.

The fifth connection line CL5 may be disposed on the (1-1)th organic layer VIA0. The fifth connection line CL5 may be electrically connected to the first electrode S1-1 of the semiconductor layer of the (1-1)th transistor ST1-1 thereunder through the contact holes CNT17 and CNT18 penetrating the second interlayer insulating film 142, the first interlayer insulating film 141, and the gate insulating layer 130. For example, the first electrode S1-1 of the semiconductor layer of the (1-1)th transistor ST1-1 interrupted by the (1-1)th organic layer VIA0 in the intra-pixel bending area may be electrically connected by the fifth connection line CL5.

In the intra-pixel bending area, the (1-2)th organic layer VIA1 may be disposed on the fifth connection line CL5. The (1-2)th organic layer VIA1 may penetrate the third interlayer insulating film 143 in the thickness direction.

The protective layer 150 may be further disposed on the (1-2)th organic layer VIA1.

Display devices according to embodiments will now be described. In the following embodiments, the same elements as those of the above-described embodiment will be indicated by the same reference numerals, and a redundant description thereof will be omitted or given briefly.

FIGS. 15 through 19 are schematic cross-sectional views of a display panel according to an embodiment.

Referring to FIGS. 15 through 19, the display panel according to the embodiment may be different from the display panel 300 according to the embodiment of FIGS. 8 through 14 in that a (1-1)th organic layer VIA0_1 further penetrates a barrier layer BR to contact a surface of a first substrate SUB1.

Other elements and features are the same as those described above, and thus a redundant description thereof is omitted.

Figure 20:
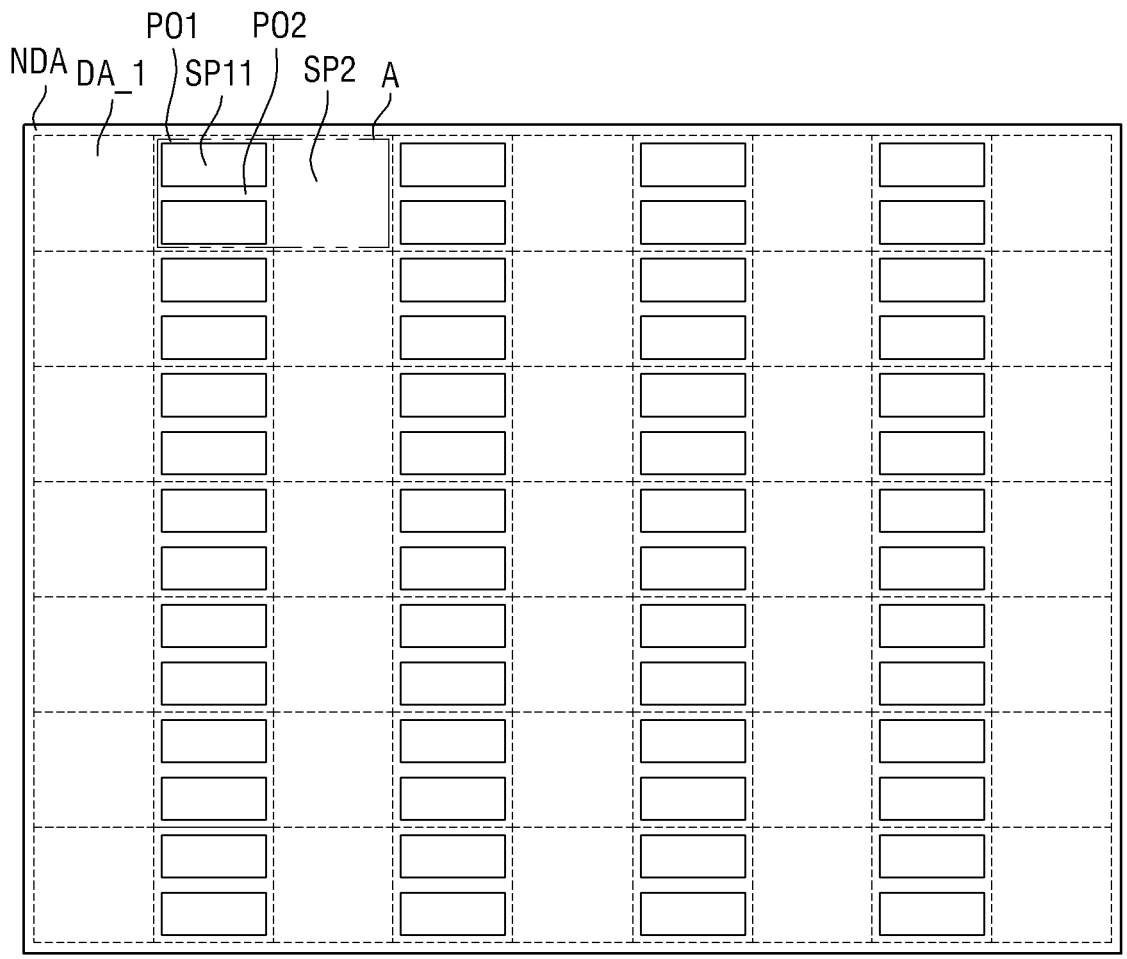
FIG. 20 is a schematic plan view of a display panel according to an embodiment.
Figure 20:
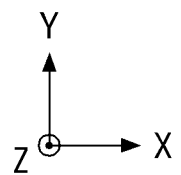

FIG. 20 is a schematic plan view of a display panel according to an embodiment.

Referring to FIG. 20, the display panel according to the embodiment may be different from the display panel 300 according to the embodiment of FIG. 5 in that a display area DA_1 may include first subpixels SP11, each including an intra-pixel bending area, and third subpixels SP2 not including the intra-pixel bending area.

For example, the display area DA_1 of the display panel according to the embodiment may include the first subpixels SP11, each including the intra-pixel bending area, and the third subpixels SP2 not including the intra-pixel bending area.

The first subpixels SP11 and the third subpixels SP2 may be alternately arranged along a first direction (X-axis direction) as illustrated in FIG. 20.

Figure 21:
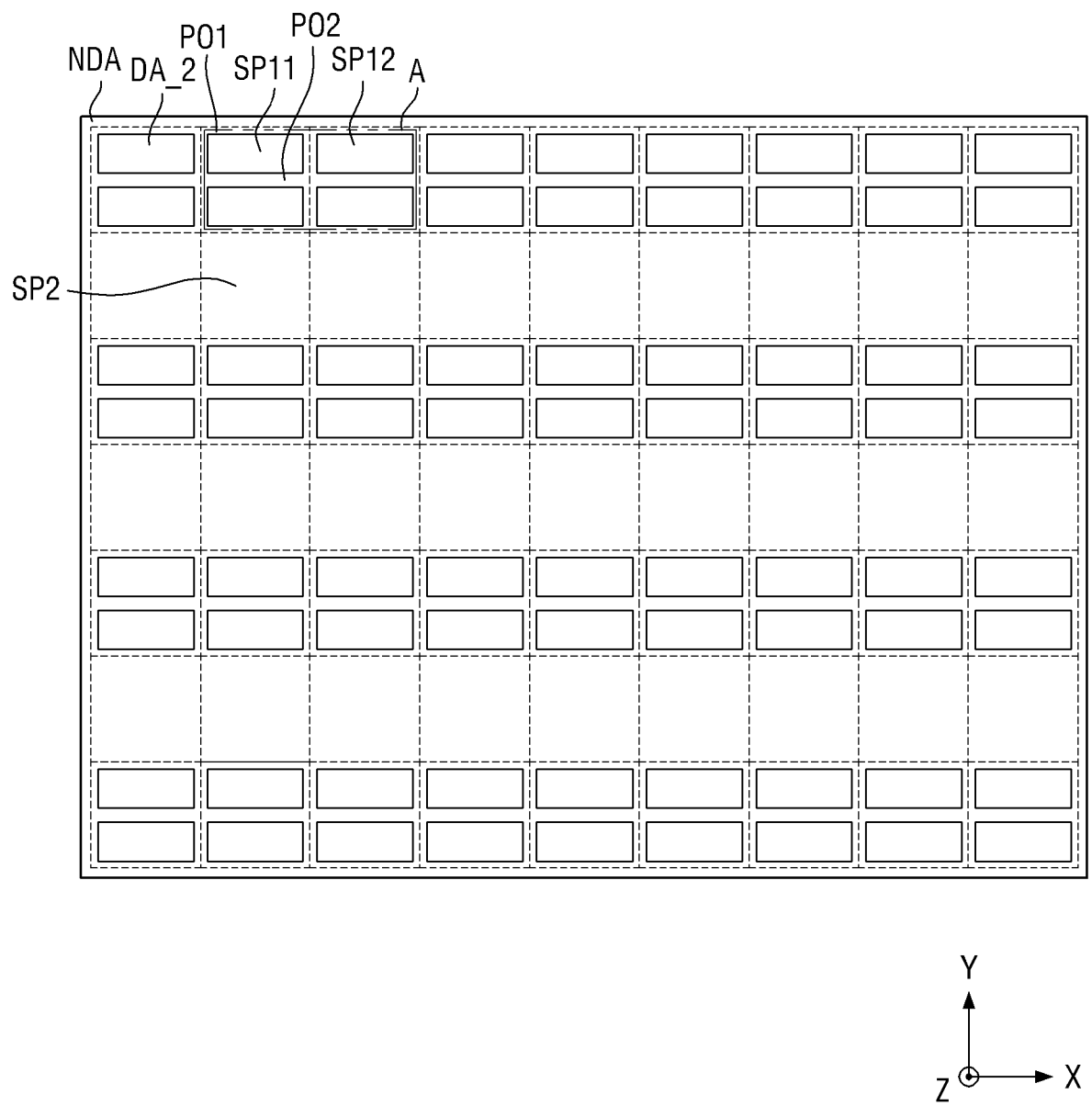
FIG. 21 is a schematic plan view of a display panel according to an embodiment.

FIG. 21 is a schematic plan view of a display panel according to an embodiment.

Referring to FIG. 21, the display panel according to the embodiment may be different from the display panel 300 according to the embodiment of FIG. 5 in that a display area DA_2 may include first subpixels SP11 and second subpixels SP12, each of the first subpixels SP11 and second subpixels SP12 including an intra-pixel bending area, and third subpixels SP2 not including the intra-pixel bending area.

For example, the display area DA_2 of the display panel according to the embodiment may include the first subpixels SP11 and second subpixels SP12, each including the intra-pixel bending area, and the third subpixels SP2 not including the intra-pixel bending area.

The first subpixels SP11 and the third subpixels SP2 may be alternately arranged along a second direction (Y-axis direction) as illustrated in FIG. 21. The first and second subpixels SP11 and SP12 may be adjacent to each other in the X-axis direction and the first and second subpixels SP11 and SP12 may alternate with the third subpixels SP2 in the X- and Y-axes directions.

Figure 22:
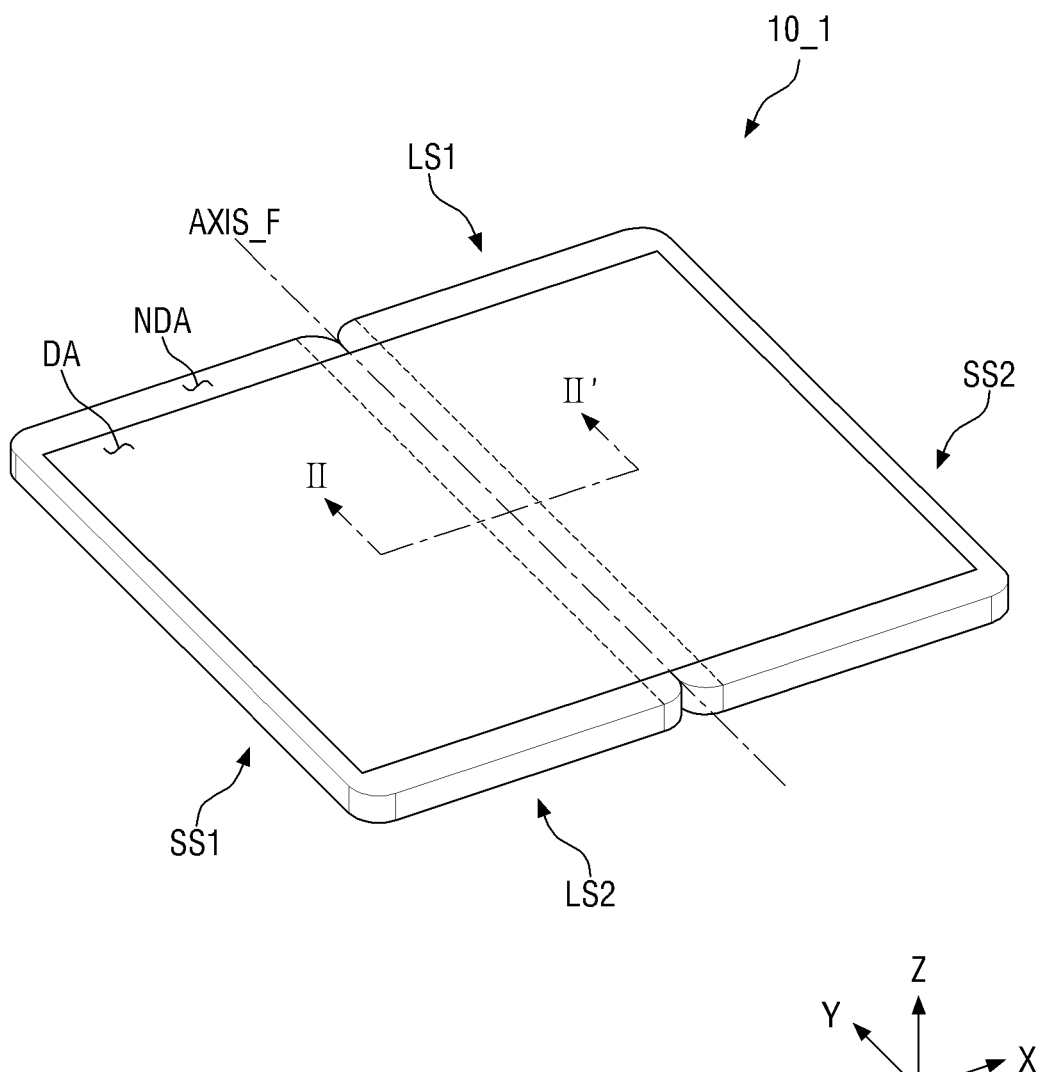
FIG. 22 is a perspective view of a display device according to an embodiment.
Figure 23:
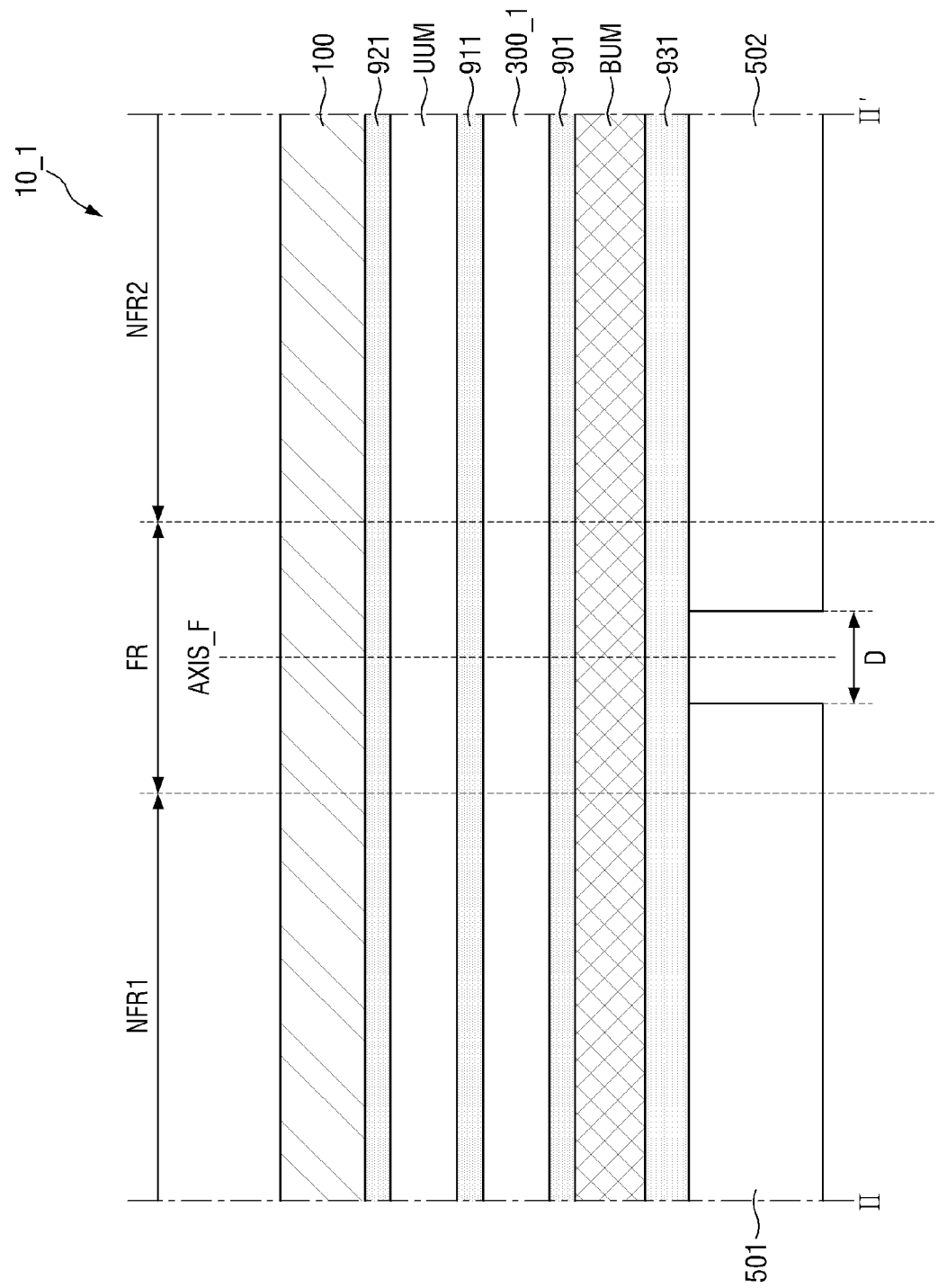
FIG. 23 is a schematic cross-sectional view taken along line II-IF of FIG. 22.
Figure 24:
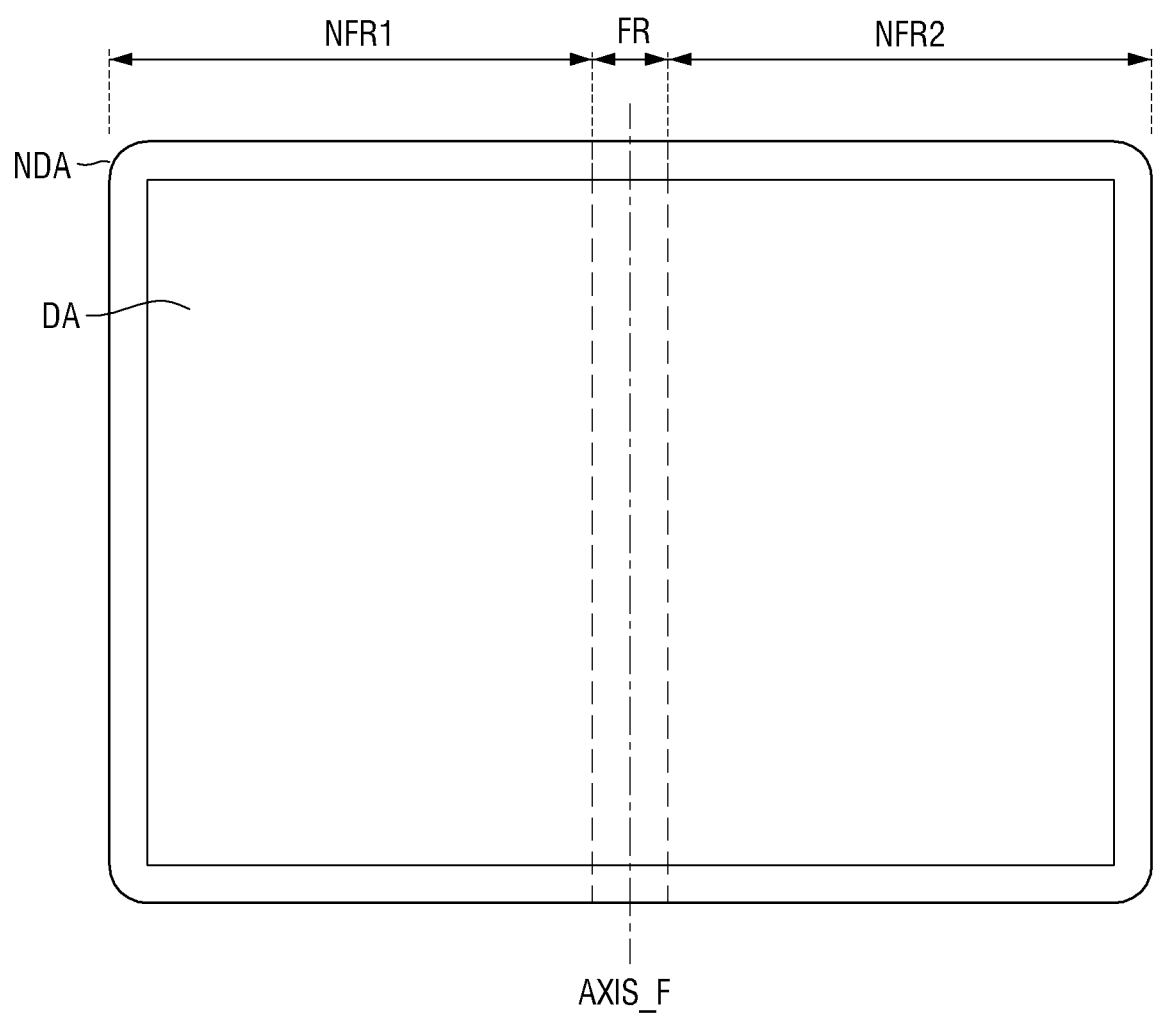
FIG. 24 is a schematic plan view of a display panel of the display device according to an embodiment.

FIG. 22 is a perspective view of a display device 10_1 according to an embodiment. FIG. 23 is a schematic cross-sectional view taken along line II-II' of FIG. 22. FIG. 24 is a schematic plan view of a display panel according to an embodiment, for example, a display panel 300_1 of the display device 10_1 in FIGS. 22 and 23.

Referring to FIGS. 22 through 24, the display device 10_1 according to the embodiment may be a display device. As used herein, the term "foldable" may refer to a flexible state, and for example, may refer to bendable, rollable, and the like. Further, the term "foldable" may be interpreted as referring to "partially foldable," "entirely foldable," "in-foldable," and/or "out-foldable." The display device 10_1 may include a folding axis AXIS_F which crosses upper and lower sides of the display device 10_1 in a plan view. The display device 10_1 may be folded about the folding axis AXIS_F.

The display device 10_1 may be substantially rectangular in a plan view. The display device 10_1 may have a rectangular planar shape with right-angled corners or a rectangular planar shape with rounded corners. The display device 10_1 may include four edges LS1, LS2, SS1 and SS2. The display device 10_1 may include long edges LS1 and LS2 and short edges SS1 and SS2. For example, the long edges LS1 and LS2 may extend in a first direction (X-axis direction), and the short edges SS1 and SS2 may extend in a second direction (Y-axis direction). The first direction (X-axis direction) defined in FIG. 22 may be the Y-axis direction of FIG. 1, and the second direction (Y-axis direction) may be the X-axis direction of FIG. 1.

As illustrated in FIG. 22, the folding axis AXIS_F may extend in a direction crossing the long edges LS1 and LS2, for example, in the second direction (Y-axis direction). For example, the long edges LS1 and LS2 of the display device 10_1 may be folded. As an alternative to what is illustrated, the folding axis AXIS_F may cross the short edges SS1 and SS2. In this case, the short edges SS1 and SS2 of the display device 10_1 may be folded. For ease of description, a case where the folding axis AXIS_F crosses the long edges LS1 and LS2 will be described below. The folding axis AXIS_F may cross a middle part of each of the long edges LS1 and LS2, but embodiments are not limited thereto.

The display device 10_1 may include a display area DA and a non-display area NDA disposed around the display area DA. The display area DA may be an area where a screen is displayed, and the non-display area NDA may be an area where no screen is displayed. The display area DA may be located in a central part of the display device 10_1. When the display device 10_1 is folded, parts of the display area DA separated by the folding axis AXIS_F may overlap each other. When the display device 10_1 is unfolded, the parts of the display area DA may be spread out to display a screen.

A groove (for example, a notch) recessed upward or downward in a plan view may be formed in an area adjacent to each of the first long edge LS1 and the second long edge LS2 of the display device 10_1 which meet the folding axis AXIS_F, and a hinge member (not illustrated) for state change may be coupled to the groove. However, embodiments are not limited thereto.

Referring to FIG. 23, the display device 10_1 may be divided into a folding area FR and non-folding areas NFR1 and NFR2 by the folding axis AXIS_F.

For example, the display device 10_1 may include the folding area FR which is disposed in the central part and includes the folding axis AXIS_F and the non-folding areas NFR1 and NFR2 which are spaced apart from each other with the folding area FR interposed between them.

The folding area FR may be an area where the display device 10_1 is folded or bent with a predetermined curvature in a folding direction, and the non-folding areas NFR1 and NFR2 may be areas where the display device 10_1 is not folded, unlike in the folding area FR. The non-folding areas NFR1 and NFR2 may respectively be located or disposed in flat surfaces that form the same plane. However, embodiments are not limited thereto, and the non-folding areas NFR1 and NFR2 may also be partially bent.

The display device 10_1 may include stacked members as illustrated in FIG. 23. The display device 10_1 may include the display panel 300_1, a lower functional member BUM disposed below the display panel 300_1, an upper functional member UUM disposed above the display panel 300_1, and a cover window 100 disposed above the upper functional member UUM.

The lower functional member BUM may be disposed below the display panel 300_1. The lower functional member BUM may include at least one functional layer. The functional layer may be a layer performing a buffer function, a heat dissipating function, an electromagnetic wave shielding function, a grounding function, a strength reinforcing function, a support function, a pressure sensing function, a digitizing function, or the like. The lower functional member BUM may be a single layer. However, the lower functional member BUM is not limited to a single layer and may also include a stack of different functional layers.

For example, the lower functional member BUM may include a buffer member. The buffer member may prevent the impact applied from the outside (for example, from under the lower functional member BUM) from being transmitted to the display panel 300_1. The buffer member may be made of a foam material such as polyurethane (PU), thermoplastic polyurethane (TPU), silicon (S1), or polydimethylacrylamide (PDMA).

The lower functional member BUM may have lower light transmittance than members disposed on the display panel 300_1 which will be described later. For example, layers disposed on the display panel 300_1 may have relatively high light transmittance to transmit light emitted upward from a display area of the display panel 300_1. On the other hand, the lower functional member BUM may have relatively low light transmittance to block light emitted downward from the display area of the display panel 300_1.

The display panel 300_1 may be disposed on the lower functional member BUM.

The display panel 300_1 may be substantially the same as the display panel 300 described above in FIG. 2, and thus a redundant description thereof is omitted.

The upper functional member UUM may be disposed on the display panel 300_1.

The upper functional member UUM may include at least one functional layer. The functional layer may be a layer performing a touch sensing function, a color filtering function, a color conversion function, a polarizing function, an antireflection function, a biometric information recognition function (for example, a fingerprint recognition function), or the like. For example, the upper functional member UUM may include an antireflection member. The functional layer may be a sheet layer made of a sheet, a film layer made of a film, a thin-film layer, a coating layer, a panel, a plate, or the like. The upper functional member UUM may be a single functional layer. However, the upper functional member UUM is not limited to a single layer and may also include a stack of different functional layers.

The cover window 100 may be disposed on the upper functional member UUM.

The display device 10_1 may include adhesive layers 901, 911 and 921 disposed between the members 100, 500, 300_1 and 400 to bond them together. A first adhesive layer 901 may be disposed between the lower functional member BUM and the display panel 300_1 to bond them together, a second adhesive layer 911 may be disposed between the display panel 300_1 and the upper functional member UUM to bond them together, and a third adhesive layer 921 may be disposed between the upper functional member UUM and the cover window 100 to bond them together.

The adhesive layers 901, 911 and 921 may be layers whose upper and lower surfaces have adhesive properties and may be, for example, pressure sensitive adhesives (PSAs), optical clear adhesives (OCAs), or optical clear resins (OCRs). The adhesive layers 901, 911 and 921 may include acrylic resin or silicone resin. In addition, the adhesive layers 901, 911 and 921 may have an elongation in a range of about of 100% to about 1,000%.

The display device 10_1 may include support plates 501 and 502 and a fourth adhesive layer 931. The support plates 501 and 502 may prevent the display panel 300_1 from being bent by an external force or may reduce the degree to which the display panel 300_1 is bent (for example, a bending angle or a bending radius of curvature). For example, the support plates 500 may keep the display panel 300_1 relatively flat against an external force.

The support plates 501 and 502 may include a rigid or semi-rigid material. For example, the support plates 500 may include a metal material such as stainless steel (SUS) or aluminum or a polymer such as polymethyl metacrylate (PMMA), polycarbonate (PC), polyvinylalcohol (PVA), acrylonitrile-butadiene-styrene (ABS) or polyethylene terephthalate (PET). For example, the support plates 500 may be stainless steel layers with a thickness in a range of about 150 μm to about 200 μm. For another example, the support plates 500 may be aluminum layers with a thickness in a range of about 150 μm to about 200 μm.

In some embodiments, the support plates 501 and 502 may include a first support plate 501 and a second support plate 502 spaced apart from each other. The first support plate 501 may overlap the first non-folding area NFR1 and a part of the folding area FR. The second support plate 502 may overlap the second non-folding area NFR2 and a part of the folding area FR. The first support plate 501 and the second support plate 502 may be spaced apart from each other by a distance D based on the folding axis AXIS_F. The distance D may be, for example, about 50 μm or less.

The fourth adhesive layer 931 may bond the support plates 501 and 502 and the lower functional member BUM together in the non-folding areas NFR1 and NFR2 and may bond anti-adhesion patterns 601 and 602 and the lower functional member BUM together in the folding area FR. The fourth adhesive layer 931 may include the same material as the adhesive layers 901, 911 and 921. The fourth adhesive layer 931 may be, but is not limited to, a PSA.

Referring to FIG. 24, pixels SP (see FIG. 5) may be disposed in the display area DA of the display device 10_1 according to the embodiment. The pixels SP, an extra-pixel bending area, and an intra-pixel bending area may be the same as those of FIG. 5, and thus a redundant description thereof is omitted.

Figure 25:
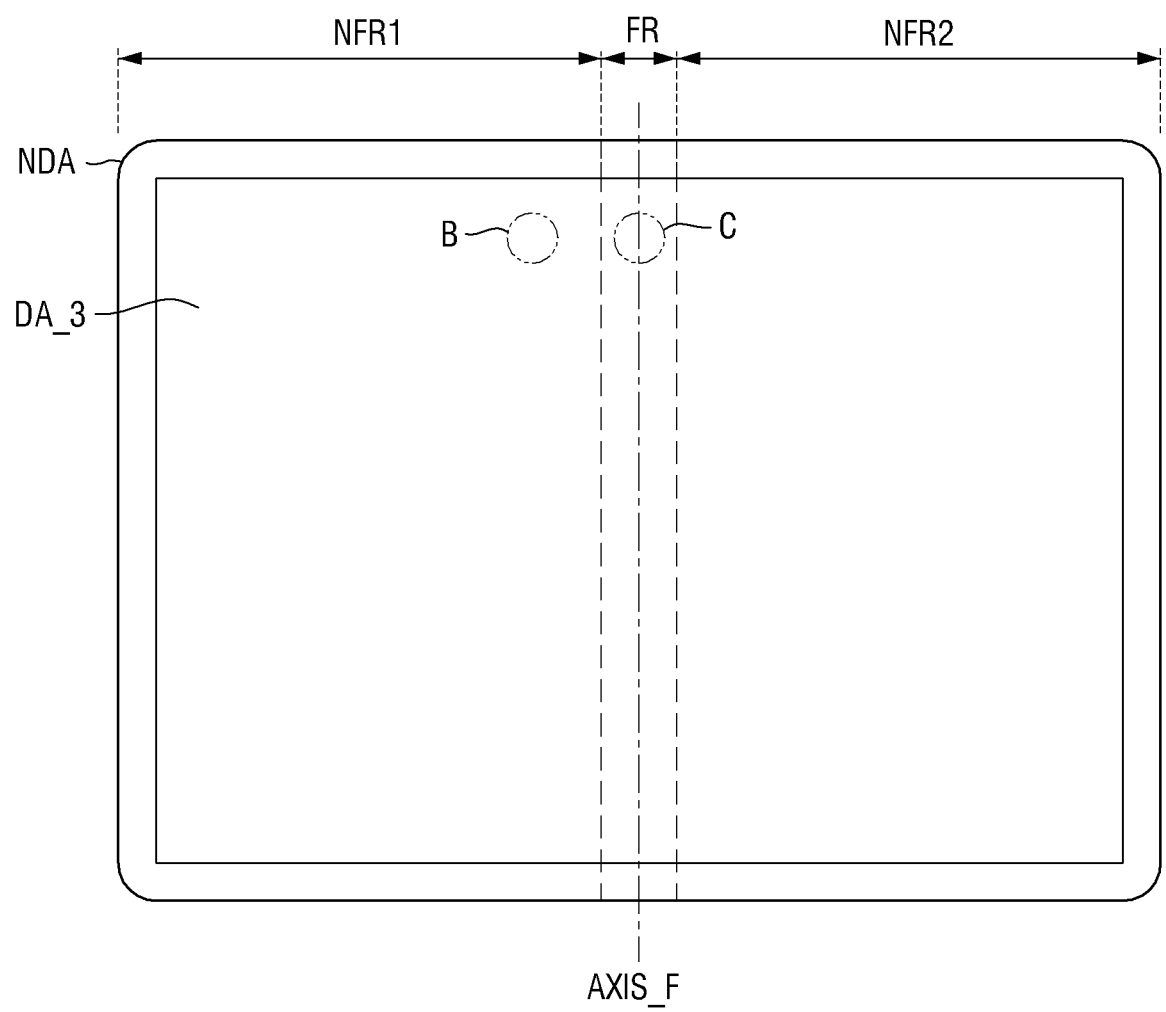
FIG. 25 is a schematic plan view of a display panel of a display device according to an embodiment.
Figure 26:
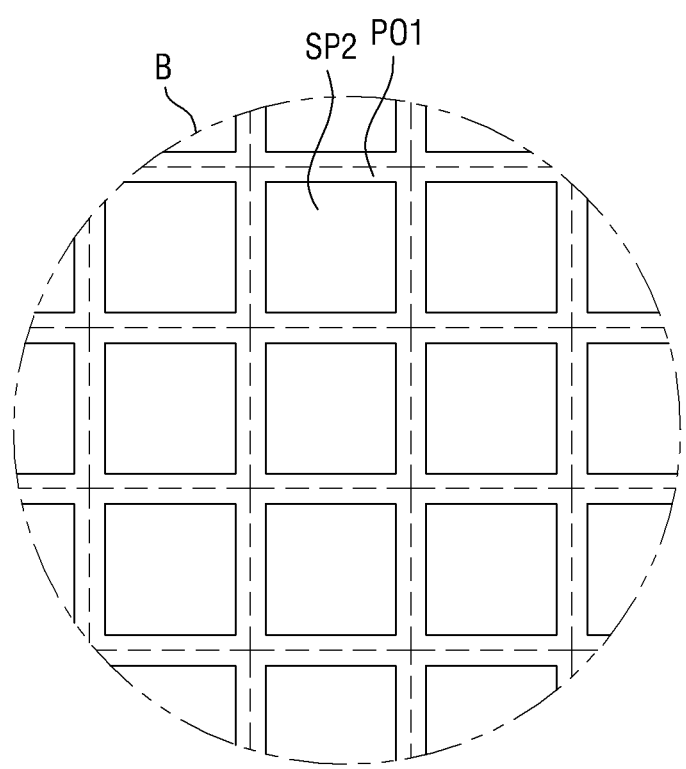
FIG. 26 is an enlarged view of area B of FIG. 25.
Figure 27:
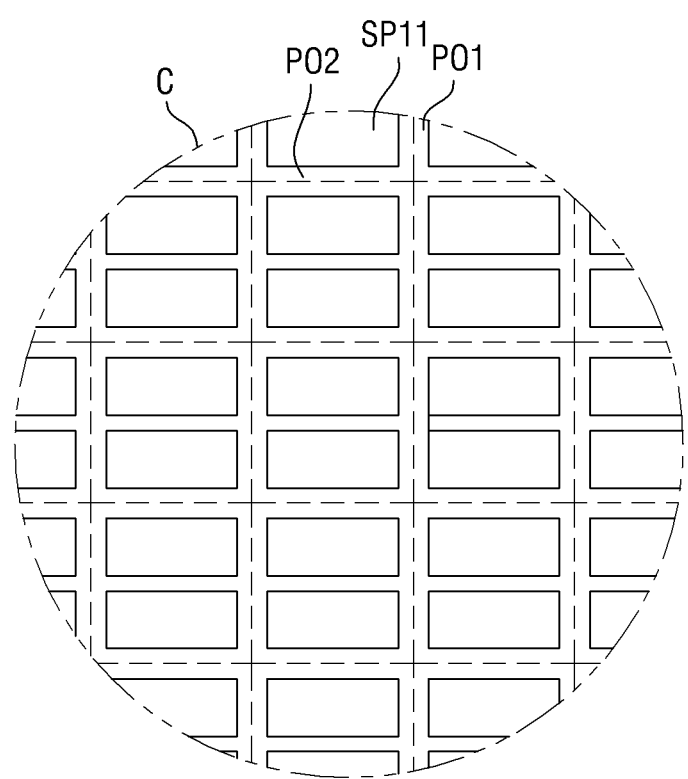
FIG. 27 is an enlarged view of area C of FIG. 25.

FIG. 25 is a schematic plan view of a display panel of a display device according to an embodiment. FIG. 26 is an enlarged view of area B of FIG. 25. FIG. 27 is an enlarged view of area C of FIG. 25.

Referring to FIGS. 25 through 27, a display area DA_3 according to the embodiment may be different from the display area DA of the display device 10_1 of FIG. 24 in that the first subpixels SP11 described above in FIG. 20 may be disposed in a folding area FR, and the third subpixels SP3 described above in FIG. 20 may be disposed in non-folding areas NFR1 and NFR2.

Other elements and features are the same as those described above with reference to FIGS. 20 and 24, and thus a redundant description thereof is omitted.

In display devices according to embodiments, cracks caused by inorganic layers in a pixel can be prevented.

However, the effects of the embodiments are not limited to the embodiments set forth herein. The above and other effects of the embodiments will become more apparent to one of ordinary skill in the art to which the embodiments pertain by referencing the claims.

While the disclosure has been shown and described with reference to embodiments thereof, it will be understood by those of ordinary skill in the art that various changes in form and detail may be made therein without departing from the spirit and scope of the disclosure as defined by the following claims. The embodiments should be considered in a descriptive sense only and not for purposes of limitation.

What is claimed is:

1. A display device having a display area and a non-display area disposed around the display area, the display device comprising:
    pixels disposed in the display area, each pixel including a plurality of subpixels with each subpixel including a light emitting element and a plurality of transistors that together cause the light emitting element to emit light of a selectable color based on data from a respective data line; and
    an intra-pixel bending area disposed along a direction of the pixels and through a first subpixel of the plurality of subpixels in plan view, the intra-pixel bending area passing between at least two transistors of the first subpixel.

2. The display device of claim 1, further comprising:
    an extra-pixel bending area disposed between at least two immediately adjacent subpixels.

3. The display device of claim 1, further comprising:
    a scan line passing through the pixels, wherein
    the intra-pixel bending area extends in a same direction as the scan line.

4. The display device of claim 3, wherein
    each of the subpixels comprises a first transistor and a third transistor, and
    the intra-pixel bending area is disposed between the first transistor and the third transistor in plan view.

5. The display device of claim 4, wherein
    the first transistor comprises a first semiconductor layer and a first gate electrode of the scan line, and
    the first semiconductor layer is interrupted in the intra-pixel bending area.

6. The display device of claim 5, wherein the first semiconductor layer comprises:
    a first active layer;
    a first electrode disposed on a side of the first active layer; and
    a second electrode disposed on the other side of the first active layer,
    wherein the second electrode is interrupted in the intra-pixel bending area.

7. The display device of claim 5, further comprising:
    a first substrate;
    a barrier layer disposed on the first substrate;
    a buffer layer disposed on the barrier layer;
    the first semiconductor layer disposed on the buffer layer;
    an insulating layer disposed on the first semiconductor layer; and
    a first bending organic layer, wherein
    the first bending organic layer penetrates the insulating layer and the first semiconductor layer in the intra-pixel bending area.

8. The display device of claim 7, wherein the first bending organic layer further penetrates the buffer layer and is disposed on a surface of the barrier layer.

9. The display device of claim 8, wherein the first bending organic layer further penetrates the barrier layer and is disposed on a surface of the first substrate.

10. The display device of claim 7, wherein
    the intra-pixel bending area further comprises an intra-pixel connection line disposed on the first bending organic layer, and
    the intra-pixel connection line electrically connects the interrupted first semiconductor layer.

11. The display device of claim 10, wherein the intra-pixel connection line and the scan line comprise different materials.

12. The display device of claim 11, wherein
    the intra-pixel connection line comprises aluminum, and
    the scan line comprises molybdenum.

13. The display device of claim 10, wherein the intra-pixel connection line extends in a direction intersecting the extending direction of the intra-pixel bending area.

14. The display device of claim 2, wherein
    the extra-pixel bending area is disposed around each of the subpixels individually.

15. The display device of claim 14, wherein the scan line is interrupted in the extra-pixel bending area.

16. The display device of claim 15, further comprising:
a first substrate;
a barrier layer is disposed on the first substrate;
a buffer layer disposed on the barrier layer;
the scan line disposed on the buffer layer;
an insulating layer disposed on the scan line; and
a second bending organic layer, wherein
the second bending organic layer penetrates the insulating layer and the scan line in the extra-pixel bending area.

17. The display device of claim 16, further comprising an extra-pixel connection line extending in a same direction as the scan line, wherein the extra-pixel connection line is disposed on the second bending organic layer.

18. The display device of claim 17, wherein the extra-pixel connection line electrically connects the interrupted scan line.

19. The display device of claim 1, wherein
the display device is foldable along a folding axis, and
parts of the display area separated by the folding axis overlap each other when the display device is folded along the folding axis.

20. The display device of claim 1, further comprising:
second pixels disposed in the display area, each second pixel including a plurality of subpixels with each subpixel including a light emitting element and a plurality of transistors that together cause the light emitting element to emit light of a selectable color based on data from a respective data line, wherein
no bending area is disposed within any subpixel of the second pixels.

21. The display device of claim 1, wherein each of the subpixels comprises:
a first transistor connected to a scan line and a third transistor, and
a drive transistor that provides a drive current for a respective light emitting element, wherein
the intra-pixel bending area is disposed between the first transistor and the drive transistor in plan view.

* * * * *